United States Patent
Sato

(10) Patent No.: US 8,107,272 B2
(45) Date of Patent: Jan. 31, 2012

(54) NONVOLATILE SEMICONDUCTOR MEMORY DEVICE, AND WRITING METHOD, READING METHOD AND ERASING METHOD OF NONVOLATILE SEMICONDUCTOR MEMORY DEVICE

(75) Inventor: Yoshihiro Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 268 days.

(21) Appl. No.: 12/474,995

(22) Filed: May 29, 2009

(65) Prior Publication Data

US 2009/0231905 A1 Sep. 17, 2009

Related U.S. Application Data

(63) Continuation of application No. PCT/JP2006/323943, filed on Nov. 30, 2006.

(51) Int. Cl.
*G11C 11/00* (2006.01)
(52) U.S. Cl. .................................. 365/148; 365/163
(58) Field of Classification Search .................. 365/148, 365/163, 189.15, 189.16
See application file for complete search history.

(56) References Cited

U.S. PATENT DOCUMENTS

| 6,801,448 | B2 * | 10/2004 | Hsu ................................ 365/148 |
| 7,742,330 | B2 * | 6/2010 | Takemura et al. ............. 365/148 |
| 7,782,651 | B2 * | 8/2010 | Tokunaga et al. ............. 365/163 |
| 2004/0174732 | A1 | 9/2004 | Morimoto |
| 2005/0052903 | A1 | 3/2005 | Hayashi |
| 2006/0050546 | A1 * | 3/2006 | Roehr .......................... 365/148 |
| 2008/0123392 | A1 | 5/2008 | Kinoshita |
| 2008/0175041 | A1 | 7/2008 | Aoki |

FOREIGN PATENT DOCUMENTS

| CN | 1551240 A | 12/2004 |
| JP | 2004-213744 A | 7/2004 |
| JP | 2004-272975 A | 9/2004 |
| WO | 2006-095389 A1 | 9/2006 |
| WO | 2006/095389 A1 | 9/2006 |
| WO | 2006/137110 A1 | 12/2006 |

OTHER PUBLICATIONS

I. G. Baek et al., "Highly Scalable Non-volatile Resistive Memory using Simple Binary Oxide Driven by Asymmetric Unipolar Voltage Pulses", IEDM, 2004, pp. 587-590.

(Continued)

*Primary Examiner* — Anh Phung
(74) *Attorney, Agent, or Firm* — Westerman, Hattori, Daniels & Adrian, LLP

(57) ABSTRACT

A nonvolatile semiconductor memory device including a memory cell including a resistance memory element which changes from a low resistance state into a high resistance state by application of a voltage which is higher than a reset voltage and lower than a set voltage and changes from the high resistance state into the low resistance state by application of a voltage higher than the set voltage; a first transistor including a first source/drain diffused layer, and having one end of the first source/drain diffused layer coupled to one end of the resistance memory element; and a second transistor including a second source/drain diffused layer, and having one end of the second source/drain diffused layer coupled to said one end of the resistance memory element and the other end of the second source/drain diffused layer coupled to the other end of the resistance memory element.

15 Claims, 13 Drawing Sheets

OTHER PUBLICATIONS

S. Seo et al., "Conductivity switching characteristics and reset currents in NiO films", Applied Physics Letters, 2005, vol. 86.

K. Kinoshita et al., "New Model Proposed for Switching Mechanism of ReRAM", IEEE NVSMW, 2006, pp. 84-85.

International Search Report of PCT/JP2006/323943, Mailing Date of Aug. 21, 2007.

Baek, I. G. et al.; "Highly Scalable Non-volatile Resistance Memory using Simple Binary Oxide Driven by Asymmetric Unipolar Voltage Pulses", IEDM, 2004, pp. 587-590.

Chinese Office Action dated Aug. 17, 2011, issued in corresponding Chinese Patent Application No. 2006800564972.(w/partial English translation).

* cited by examiner

NONVOLATILE SEMICONDUCTOR MEMORY DEVICE, AND WRITING METHOD, READING METHOD AND ERASING METHOD OF NONVOLATILE SEMICONDUCTOR MEMORY DEVICE

CROSS-REFERENCE TO RELATED APPLICATION

This application is a Continuation of PCT application No. PCT/JP2006/323943, which was filed on Nov. 30, 2006, and which designated the United States of America, the entire contents of which are incorporated herein by reference.

FIELD

The embodiments discussed herein are related to a nonvolatile semiconductor memory device, and a writing method, a reading method and an erasing method of a nonvolatile semiconductor memory device.

BACKGROUND

Recently, as a new memory device, a nonvolatile semiconductor memory device called ReRAM (Resistance Random Access Memory) is noted. The ReRAM uses resistance memory elements which have a plurality of resistance states of different resistance values and have the resistance states changed by external application of electric stimuli, and is used as a memory device by corresponding the high resistance state and the low resistance state of the resistance memory elements to, e.g., "0" and "1" of information. The ReRAM is very prospective because the ReRAM can realize the high speed, large capacities, low electric power consumption, etc.

The resistance memory element includes a resistance memory material whose resistance state is changed by the application of voltages sandwiched between a pair of electrodes. As the typical resistance memory material is known the transition metal content oxide material.

Related references are as follows:
Patent Reference 1: Japanese Laid-open Patent Publication No. 2004-213744
Non-Patent Reference 1: I. G. Baek et al., "Highly Scalable Non-volatile Resistance Memory using Simple Binary Oxide Driven by Asymmetric Unipolar Voltage Pulses", IEDM 2004
Non-Patent Reference 2: S. Seo et al., "Conductivity switching characteristics and reset currents in NiO films", Applied Physics Letters 86, 093509 (2005)
Non-Patent Reference 3: K. Kinoshita et al., "New Model Proposed for Switching Mechanism of ReRAM", IEEE NVSMW 2006, p. 84-85

SUMMARY

According to aspects of an embodiment, a nonvolatile semiconductor memory device including a memory cell including a resistance memory element which changes from a low resistance state into a high resistance state by application of a voltage which is higher than a reset voltage and lower than a set voltage and changes from the high resistance state into the low resistance state by application of a voltage higher than the set voltage; a first transistor including a first gate electrode and a first source/drain diffused layer, and having one end of the first source/drain diffused layer coupled to one end of the resistance memory element; and a second transistor including a second gate electrode and a second source/drain diffused layer, and having one end of the second source/drain diffused layer coupled to said one end of the resistance memory element and the other end of the second source/drain diffused layer coupled to the other end of the resistance memory element.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

Figure 13:
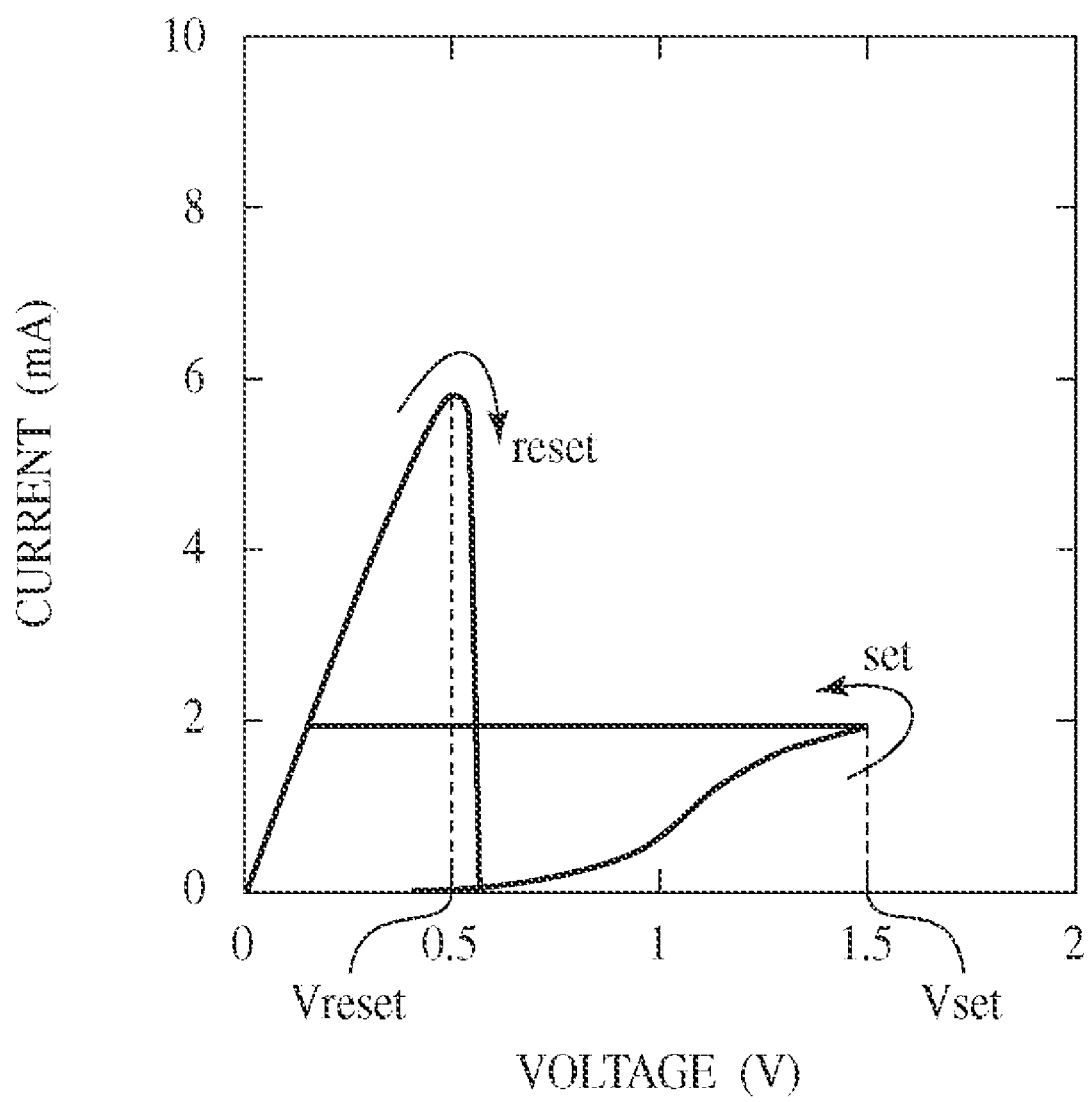
FIG. 13 is a graph of the I-V characteristics of the resistance memory element.

FIG. 13 illustrates a graph of the I-V characteristics of the resistance memory element. As illustrated in FIG. 13, as a voltage to be applied to the resistance memory element in the high resistance state is gradually raised, the resistance value abruptly decreases when the voltage exceeds a certain value (set voltage $V_{set}$), and the resistance memory element transits to the low resistance state. This operation is called "set". On the other hand, a voltage to be applied to the resistance memory element in the low resistance state is gradually raised, the resistance value abruptly increases when the voltage exceeds a certain value (reset voltage $V_{reset}$), and the resistance memory element transits to the high resistance state. This operation is called "reset".

These operations make it possible to control the resistance state of the resistance memory element by simply applying voltages to the resistance memory element. Data can be read by measuring the value of a current flowing in the element when a voltage which does not cause the reset is applied to the element.

In the method of simply applying a voltage to the resistance memory element to thereby reset the resistance memory from the low resistance state into the high resistance state, due to the resistance value increase accompanying the resistance state change from the high resistance state to the low resistance state, an excessive voltage which exceeds the reset voltage is applied to the resistance memory element immediately after reset. When this voltage is higher than the set voltage, the resistance memory element transits from the high resistance state to the low resistance state, which makes it impossible to make the normal write operation.

Preferred embodiments will be explained with reference to accompanying drawings.

[a] First Embodiment

Figure 1:
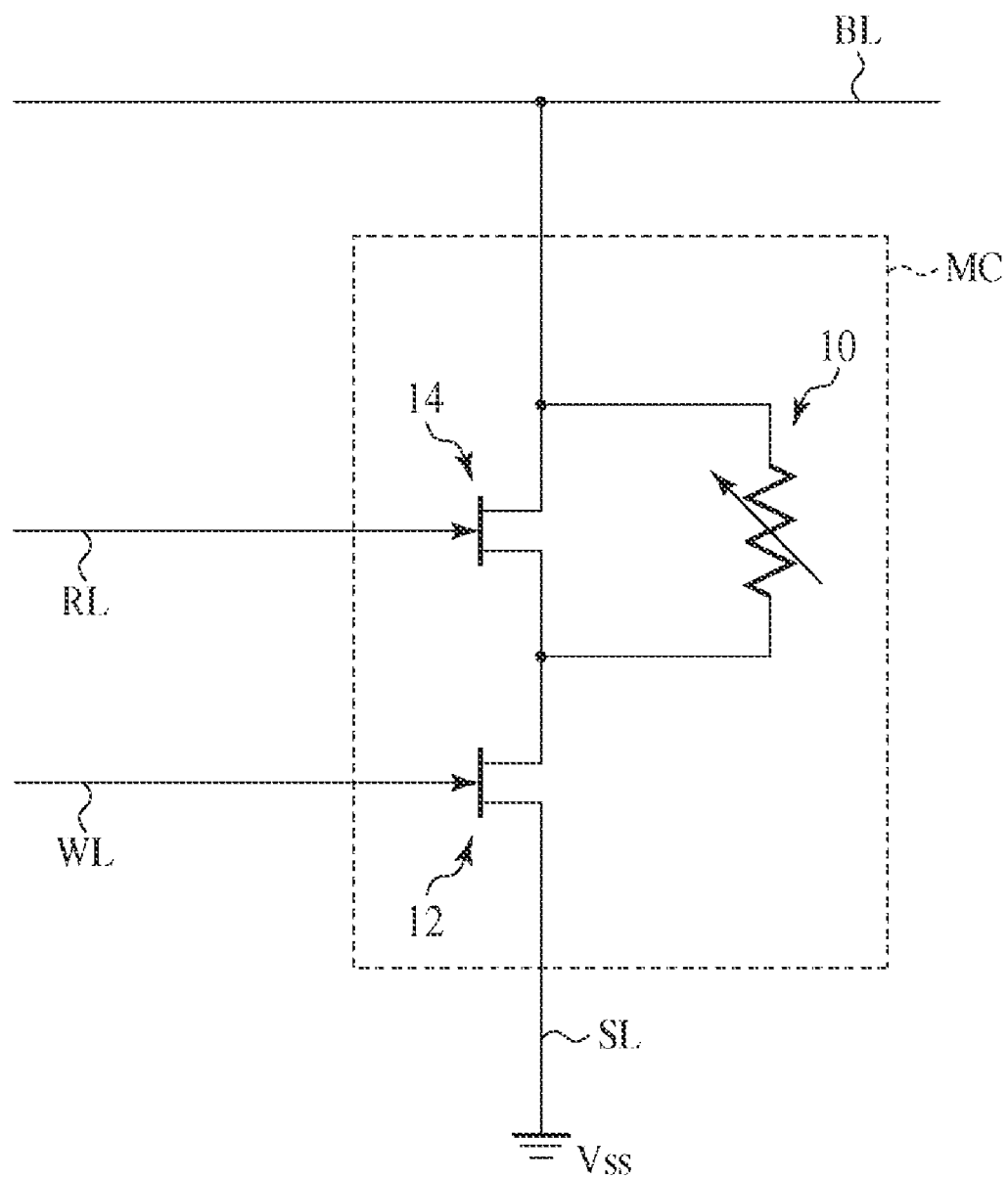
FIG. 1 is circuit diagram of the memory cell of the nonvolatile semiconductor memory device according to a first embodiment.

The nonvolatile semiconductor memory device according to a first embodiment, and the writing method, the reading method and the erasing method of the nonvolatile semiconductor memory device will be explained with reference to FIGS. 1 to 8. FIG. 1 is the circuit diagram of the nonvolatile semiconductor memory device according to the present embodiment, which illustrates the memory cell.

(Memory Cell)

The memory cell of the nonvolatile semiconductor memory device according to the present embodiment will be explained with reference to FIG. 1.

As illustrated in FIG. 1, the memory cell MC of the nonvolatile semiconductor memory device according to the present embodiment includes a resistance memory element 10, a first transistor (selective transistor 12) and a second transistor 14.

The resistance memory element 10 memorizes the high resistance state and the low resistance state, and the high resistance state and the low resistance state are switched from each other by the application of voltages. When a voltage which is higher than the reset voltage and lower than the set voltage is applied to the resistance memory element 10, the resistance memory element 10 is changed from the low resistance state to the high resistance state. On the other hand, when a voltage which is higher than the set voltage is applied to the resistance memory element 10, the resistance memory element 10 is changed from the high resistance state to the low resistance state.

The resistance value $R_{low}$ of the resistance memory element 10 in the low resistance state is, e.g., about some k$\Omega$s. The resistance value $R_{low}$ of the resistance memory element 10 in the low resistance state is set here at, e.g., about 3 k$\Omega$.

On the other hand, the resistance value $R_{high}$ of the resistance memory element 10 in the high resistance state is, e.g., about tens k$\Omega$s-1000 k$\Omega$s. The resistance value $R_{high}$ of the resistance memory element 10 in the high resistance state is set here at, e.g., about 100 k$\Omega$. The resistance value $R_{high}$ of the resistance memory element 10 in the high resistance state depends on an area of the resistance memory element 10. Accordingly, the resistance value $R_{high}$ of the resistance memory element 10 in the high resistance state can be set at a desired value by suitably setting the area of the resistance memory element 10.

The resistance memory element 10 has one end electrically coupled to one end, i.e., the drain terminal of the source/drain diffused layer of the first transistor 12. The resistance memory element 10 has the other end electrically coupled to a bit line BL.

The first transistor 12 has the other end (source terminal) of the source/drain diffused layer coupled to the ground potential $V_{ss}$. The on-resistance (channel resistance) $R_{tr1\_on}$ of the first transistor 12 is set at, e.g., about 4 k$\Omega$. The on-resistance of a transistor is the resistance between the source and the drain at the time when the transistor is on. With the gate length of the first transistor 12 set at, e.g., about 0.7 µm and the gate length of the first transistor 12 set at, e.g., about 0.18 µm, the on-resistance $R_{tr1\_on}$ on of the first transistor 12 can be, e.g., about 4 k$\Omega$. The gate electrode of the first transistor 12 is coupled to a word line WL.

The second transistor 14 has one end (source terminal) of the source/drain diffused layer coupled to one end (drain terminal) of the source/drain diffused layer of the first transistor 12. The second transistor 14 has the other end (source terminal) of the source/drain diffused layer coupled to one end of the resistance memory element 10. The second transistor 14 has the other end (drain terminal) of the source/drain diffused layer coupled to the other end of the resistance memory element 10. The second transistor 14 has the other end (drain terminal) of the source/drain diffused layer electrically coupled to a bit line BL. The second transistor 14 is for sustaining the resistance memory element 10 in the high resistance state when the resistance memory element 10 is changed from the low resistance state to the high resistance state. The on-resistance (channel resistance) $R_{tr2\_on}$ of the second transistor 14 is set at, e.g., about 10 k$\Omega$. The on-resistance $R_{tr2\_on}$ of the second transistor 14 can be set at, e.g., about 10 k$\Omega$ by setting the gate width of the second transistor 14 at, e.g., about 3.6 µm and the gate length of the second transistor 14 at, e.g., about 0.18 µm.

Preferably, the on-resistance $R_{tr2\_off}$ of the second transistor 14 is set larger than the resistance value $R_{low}$ of the resistance memory element 10 in the low resistance state and smaller than the resistance value $R_{high}$ of the resistance memory element 10 in the high resistance state. To sustain the resistance memory element 10 in the high resistance state when the resistance memory element 10 is changed from the low resistance state into the high resistance state, it is suitable to set the on-resistance $R_{tr2\_on}$ of the second transistor 14 at such value.

Preferably, the off-resistance $R_{tr2\_on}$ of the second transistor 14 is set smaller than the resistance value $R_{high}$ of the resistance memory element 10 in the high resistance state. The off-resistance $R_{tr2\_off}$ of the second transistor 14 is set smaller than the resistance value $R_{high}$ of the resistance memory element 10 in the high resistance state for the following reason. That is, when the resistance value $R_{high}$ of the resistance memory element 10 in the high resistance state is very high, and the off-resistance $R_{tr2\_off}$ of the second transistor 14 is higher than the resistance value $R_{high}$ of the resistance memory element 10 in the high resistance state, the current flowing in the bit line BL when information written in a memory cell MC is read becomes very small. In this case, it is very difficult to judge whether the current flowing in the bit line BL is small because the resistance memory cell 10 of the selected memory cell MC is in the high resistance state or the current flowing in the bit line BL is small because the read is being made with the memory cell MC not selected. However, the off-resistance $R_{tr2\_off}$ of the second transistor 14 is set smaller than the resistance value $R_{high}$ of the resistance memory element 10 in the high resistance state, whereby even when the high resistance state is written in the resistance memory element 10 of a memory cell MC, some current flows in the bit line BL when the information written in the memory cell MC is read. The difference between the current flowing in the bit line BL when the high resistance sate is written in the resistance memory element 10 of a selected memory cell MC and the current flowing in the bit line BL when the read is being made with the memory cell MC not selected can be made large. The off-resistance $R_{tr2\_off}$ of the second transistor 14 is set smaller than the resistance value $R_{high}$ of the resistance memory element 10 in the high resistance state, whereby read errors can be prevented.

Writing the high resistance state into the resistance memory element 10 of a memory cell MC is made by applying a prescribed voltage to the bit line BL with the first transistor 12 and the second transistor 14 tuned on-state. The value of the resistance $R_{tr2\_on}$ of the second transistor 14 is so set that the resistance memory element 10 is sustained in the high resistance state when the resistance memory element 10 is changed from the low resistance state to the high resistance state.

For example, with the resistance value $R_{low}$ of the resistance memory element 10 in the low resistance state set at 3 k$\Omega$, the on-resistance $R_{tr1\_on}$ of the first transistor 12 set at 4 k$\Omega$, and the on-resistance $R_{tr2\_on}$ of the second transistor 14 set at 10 k$\Omega$, when 1.8 V as the source voltage $V_{dd}$ is applied to the bit line BL, the voltage applied to the resistance memory element 10 is about 0.66 V. The voltage which is higher than the reset voltage $V_{reset}$ is applied to the resistance memory element 10, whereby the resistance memory element 10 is changed from the low resistance state to the high resistance state.

When the resistance value $R_{high}$ of the resistance memory element 10 which has been changed from the low resistance state to the high resistance state is 100 k$\Omega$, the voltage applied to the resistance memory element 10 becomes about 1.25 V. No excessively high voltage is applied to the resistance memory element 10 which has been changed from the low resistance state to the high resistance state, because the second transistor 14, which has a suitable on-resistance $R_{tr2\_on}$, is coupled to the resistance memory element 10 in parallel. The voltage, which is higher than the reset voltage $V_{reset}$ and lower than the set voltage $V_{set}$, is applied to the resistance memory element 10, whereby the resistance memory element 10 is sustained in the high resistance state.

The reading method, writing method and erasing method of the nonvolatile semiconductor memory device according to the present embodiment will be detailed later.

(Circuit Structure)

Figure 2:
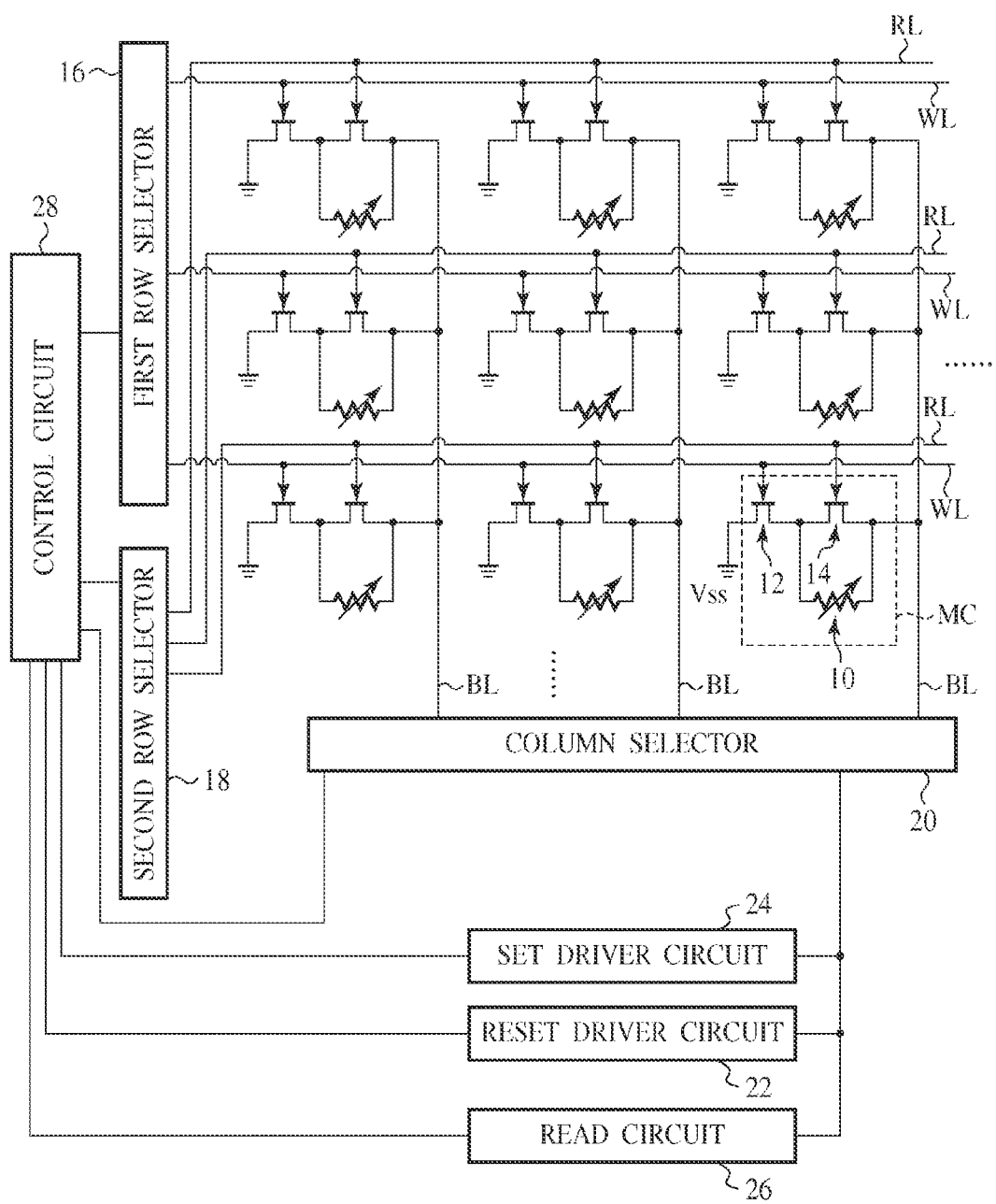
FIG. 2 is a circuit diagram of the nonvolatile semiconductor memory device according to the first embodiment.

The circuit structure of the nonvolatile semiconductor memory device according to the present embodiment will be explained with reference to FIG. 2. FIG. 2 is the circuit diagram of the nonvolatile semiconductor memory device according to the present embodiment.

As illustrated in FIG. 2, the memory cell MC including the resistance memory element 10, the first transistor 12 and the second transistor 14 is arranged in a matrix.

The gate electrodes of the first transistors 12 of the memory cells MC present in the same row are coupled commonly by a word line WL. A plurality of the word lines WL are coupled to a first row selector 16. The first row selector 16 applies a prescribed voltage to the word line WL coupled to a memory cell MC to be selected.

The gate electrodes of the second transistors 14 of the memory cells MC present in the same row are commonly coupled by a reset line RL. The reset line RL is formed in parallel with the word line WL. A plurality of the reset lines RL are coupled to the second row selector 18. The second row selector 18 is for applying a prescribed voltage to the reset line RL of a memory cell MC to be selected.

One ends of the resistance memory elements 10 and one ends (drain terminals) of the source/drain diffused layers of the second transistors 14 of the memory cells MC present in the same column are commonly coupled by a bit line BL. The bit line BL are formed, intersecting the word line WL and reset line RL. A plurality of the bit lines BL are coupled to a column selector 20. The column selector 20 is for applying a prescribed voltage to the bit line BL of a memory MC to be selected.

The source terminals of the first transistors 12 are coupled to the ground potential VsS.

A set driver circuit 24, a reset driver circuit 22 and a read circuit 26 are coupled to the column selector 20.

The set driver circuit 24 is for applying a prescribed voltage to the bit lines when the resistance memory elements 10 are set, i.e., when the resistance memory elements 10 are changed from the high resistance state into the low resistance state.

The reset driver circuit 22 is for applying a prescribed voltage to the bit lines BL when the resistance memory elements 10 are reset, i.e., when the resistance memory elements 10 are changed from the low resistance state to the high resistance state.

The read circuit 26 includes a sense amplifier (not illustrated). The read circuit 26 detects currents flowing in the bit lines BL by the sense amplifiers. The read circuit 26 reads information written in the memory cells MC, based on currents flowing in the bit lines BL.

The first row selector 16, the second row selector 18, the column selector 20, the set driver circuit 24, the reset driver circuit 22 and the read circuit 26 are coupled to a control circuit 28 which control the whole.

Thus, the nonvolatile semiconductor memory device according to the present embodiment is constituted.

The writing method, the reading method and the erasing method of the nonvolatile semiconductor memory device according to the present embodiment will be explained with reference to FIG. 2.

(Writing Method)

The reset of the resistance memory elements 10, i.e., writing the high resistance state into the resistance memory elements 10 will be explained with reference to FIG. 2.

When the high resistance state is written into the resistance memory elements 10, the word line WL coupled to the memory cell MC to be written is selected by the first row selector 16. Specifically, the first row selector 16 applies a prescribed voltage to the word line WL coupled to the memory cell MC to be written. Thus, the first transistor 12 of the memory cell MC to be written is turned on.

The reset line RL coupled to the memory cell MC to be written is selected by the second row selector 18. Specifically, the second row selector 18 applies a prescribed voltage to the reset line RL coupled to the memory cell MC to be written. Thus, the second transistor 14 of the memory cell MC to be written is turned on.

Next, the bit line BL coupled to the memory cell MC to be written is selected by the column selector 20. Thus, the bit line BL selected by the column selector 20 is coupled to the reset deriver circuit 22. The reset deriver circuit 22 applies a prescribed voltage to the selected bit line BL for a prescribed period of time. The voltage to be applied to the selected bit line BL is, e.g., the source voltage $V_{dd}$.

Thus, the high resistance state is written in the resistance memory element 10 of the memory cell MC to be written. In the present embodiment, the second transistors 14 are coupled to the resistance memory elements 10 in parallel, and when the high resistance state is written in the resistance memory elements 10, the second transistors 14 are on, whereby the application of a voltage higher than the set voltage to the resistance memory elements 10 which has been changed into the high resistance state can be prevented. According to the present embodiment, the resistance memory elements 10 which have been changed from the low resistance state into the high resistance state are prevented from returning to the low resistance state, whereby the normal write operation can be made.

The reset of the resistance memory elements 10, i.e., the write of the low resistance state into the resistance memory elements 10 will be explained with reference to FIG. 2.

When the low resistance state is written in the resistance memory elements 10, the source line WL coupled to a memory cell MC to be written is selected by the first row selector 16. Specifically, the first row selector 16 applies a prescribed voltage to the word line WL coupled to the memory cell MC to be written. Thus, the first transistor 12 of the memory cell MC to be written is turned on.

However, no voltage is applied to the reset line RL coupled to the memory cell MC to be written. Accordingly, the second transistor 14 of the memory cell MC to be written is off.

Next, the bit line coupled to the memory cell MC to be written is selected by the column selector 20. Thus, the bit line BL selected by the column selector 20 is coupled to the set driver circuit 24. The set driver 24 applies a prescribed voltage to the selected bit line BL for a prescribed period of time. The period of time of applying the prescribed voltage to the selected bit line BL is, e.g., some nanoseconds.

Thus, the low resistance state is written into the resistance memory element 10 of the memory cell MC to be written.

(Reading Method)

The reading method of the nonvolatile semiconductor memory device according to the present embodiment will be explained with reference to FIG. 2.

When information written in the resistance memory elements 10 of the memory cells MC is read, the word line WL coupled to a memory cell MC to be read is selected by the first row selector 16. Specifically, the first row selector 16 applies prescribed voltage to the word line WL coupled to the memory cell MC to be read. Thus, the first transistor 12 of the memory cell MC to be read is turned on.

No voltage is applied to the reset line RL coupled to the memory cell MC to be read. Accordingly, the second transistor 14 of the memory cell MC to be read is off.

Then, the bit line BL coupled to the memory cell MC to be read is selected by the column selector 20. Thus, the bit line BL selected by the column selector 20 is coupled to the read circuit 26. When the high resistance state is written in the resistance memory element 10 of the memory cell MC to be read, a relatively small current flows in the bit line BL. When the low resistance state is written in the resistance memory element 10 of the memory cell MC to be read is written, a relatively large current flows in the bit line BL. The read circuit 26 detects a current flowing in the bit line BL by the sense amplifier to thereby judge whether the resistance memory element 10 is in the low resistance state or in the high resistance state. That is, the read circuit 26 reads information written in the resistance memory element 10, based on the current flowing in the bit line BL.

The reading method is explained by means of the example that the read is made here with the second transistor 14 of a memory cell MC to be read turned off. The reading may be made with the second transistor 14 of a memory cell MC to be read turned on. In this case, the voltage to be applied to the gate terminals of the second transistors 14 may be suitably set. The reading is made with the second transistors 14 turned on for the following reason. That is, when the resistance value $R_{high}$ of the resistance memory elements 10 in the high resistance state is very high, and the off-resistance $R_{tr2\_off}$ of the second transistors 14 is also very high, the current which flows in the bit line BL when information written in the memory cells MC is read is very small. In this case, it is very difficult to judge whether the current flowing in the bit line BL is very small because the high resistance state is written in the resistance memory element 10 of the selected memory cell MC or the current flowing in the bit line BL is very small because the reading is made with the memory cell MC not selected. However, the reading is made with the second transistor 14 turned on, whereby even with the high resistance state written in the resistance memory element 10 of the memory cell MC, some current flows in the bit line BL when information written in the resistance memory element 10 is read. Accordingly, the difference between the current flowing in the bit line BL when the high resistance state is written in the resistance memory element 10 of a selected memory cell MC and the current flowing in the bit line BL when the reading is made with the memory cell MC not selected can be made large. Thus, the reading is made with the second transistor 14 turned on, whereby the reading error can be prevented.

(Erasing Method)

The erasing method of the nonvolatile semiconductor device according to the present embodiment will be explained with reference to FIG. 2.

When information written in the resistance memory elements 10 of the memory cells MC present in the same column is block erased, the erasing is made as follows.

First, all the word lines WL are selected by the first row selector 16. Specifically, the first row selector 16 applies a prescribed voltage to all the word lines WL. Thus, the first transistors 12 of all the memory cells MC are turned on.

All the reset lines RL are selected by the second row selector. Specifically, the second row selector 18 applies a prescribed voltage to all the reset lines RL. Thus, the second transistors 14 of all the memory cells MC are turned on.

Next, the bit lines BL coupled to the memory cells MC of the column to be erased are selected by the column selector 20. Thus, the bit lines BL selected by the column selector 20 are coupled to the reset driver circuit 22. The reset driver circuit 22 applies a prescribed voltage to the selected bit lines BL for a prescribed period of time.

Thus, the information written in the resistance memory elements 10 of the memory cells MC present in the column to be erased is block erased. That is, the high resistance state is block written in the resistance memory elements 10 of the memory cells MC present in the column to be erased.

The bit lines BL are sequentially selected by the column selector 20, whereby information written in the resistance memory elements 10 of all the memory cells MC can be erased.

In the present embodiment, the second transistors 14 are coupled to the resistance memory elements 10 in parallel, and the second transistors 14 are on-state when information written in the resistance memory elements 10 is erased, whereby the application of a voltage higher than the set voltage to the resistance memory elements 10 changed into the high resistance state can be prevented. Thus, according to the present embodiment, the resistance memory elements 10 which have changed from the low resistance state into the high resistance state can be prevented from returning to the low resistance state, whereby the normal erase operation can be made.

When information written in the resistance memory elements 10 of all the memory cells is block erased, the following operation is made.

First, all the word lines WL are selected by the first row selector 16. Specifically, the first row selector 16 applies a prescribed voltage to all the word lines WL. Thus, the first transistors 12 of all the memory cells MC are turned on.

All the reset lines RL are selected by the second row selector 14. Specifically, the second row selector 18 applies a prescribed voltage to all the reset lines RL. Thus, the second transistors 14 of all the memory cells MC are turned on.

Next, all the bit lines BL are selected by the column selector 20. Thus, all the bit lines BL are coupled to the reset driver circuit 22. The reset deriver circuit 22 applies a prescribed voltage to all the bit lines BL for a prescribed period of time.

Thus, information written in the resistance memory elements 10 of all the memory cells MC is block erased. That is the high resistance state is written in the resistance memory elements 10 of all the memory cells MC is block written.

(Structure of Nonvolatile Semiconductor Memory Device)

Figure 3:
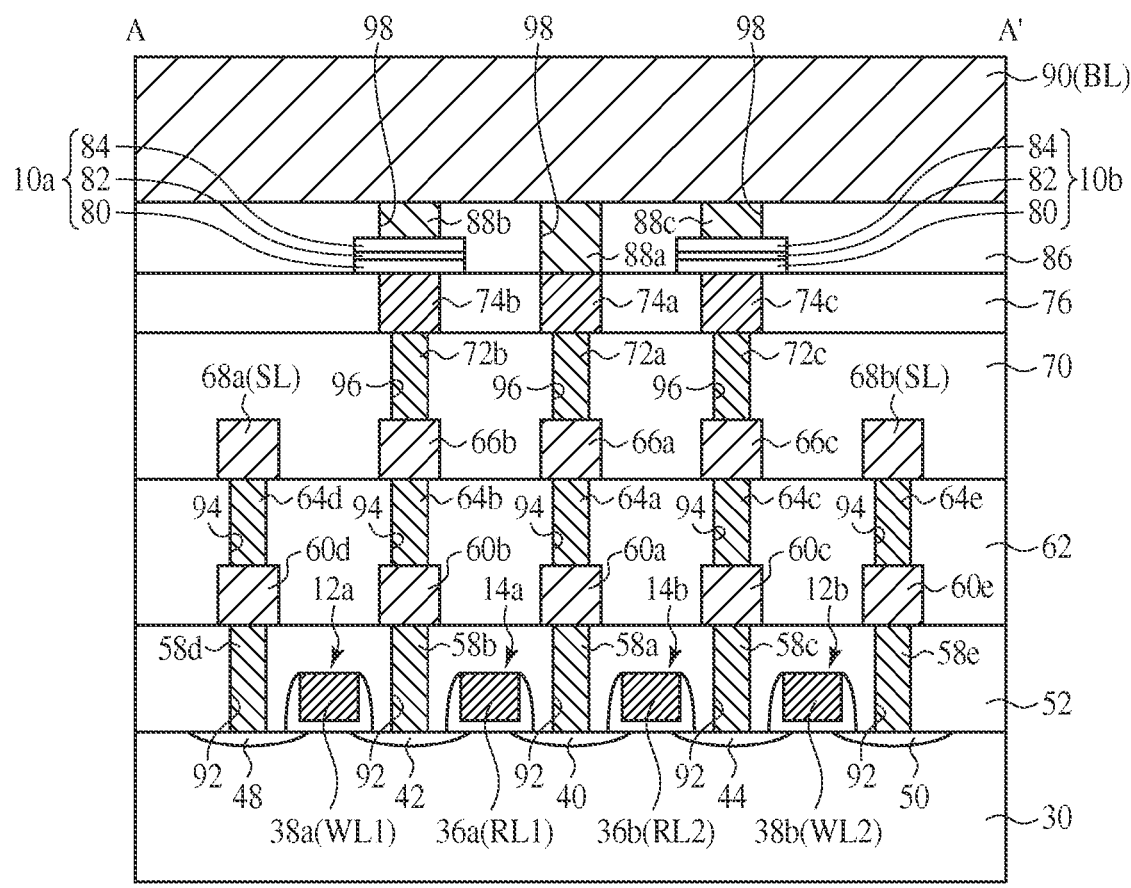
FIG. 3 is a sectional view of the nonvolatile semiconductor memory device according to the first embodiment.
Figure 4:
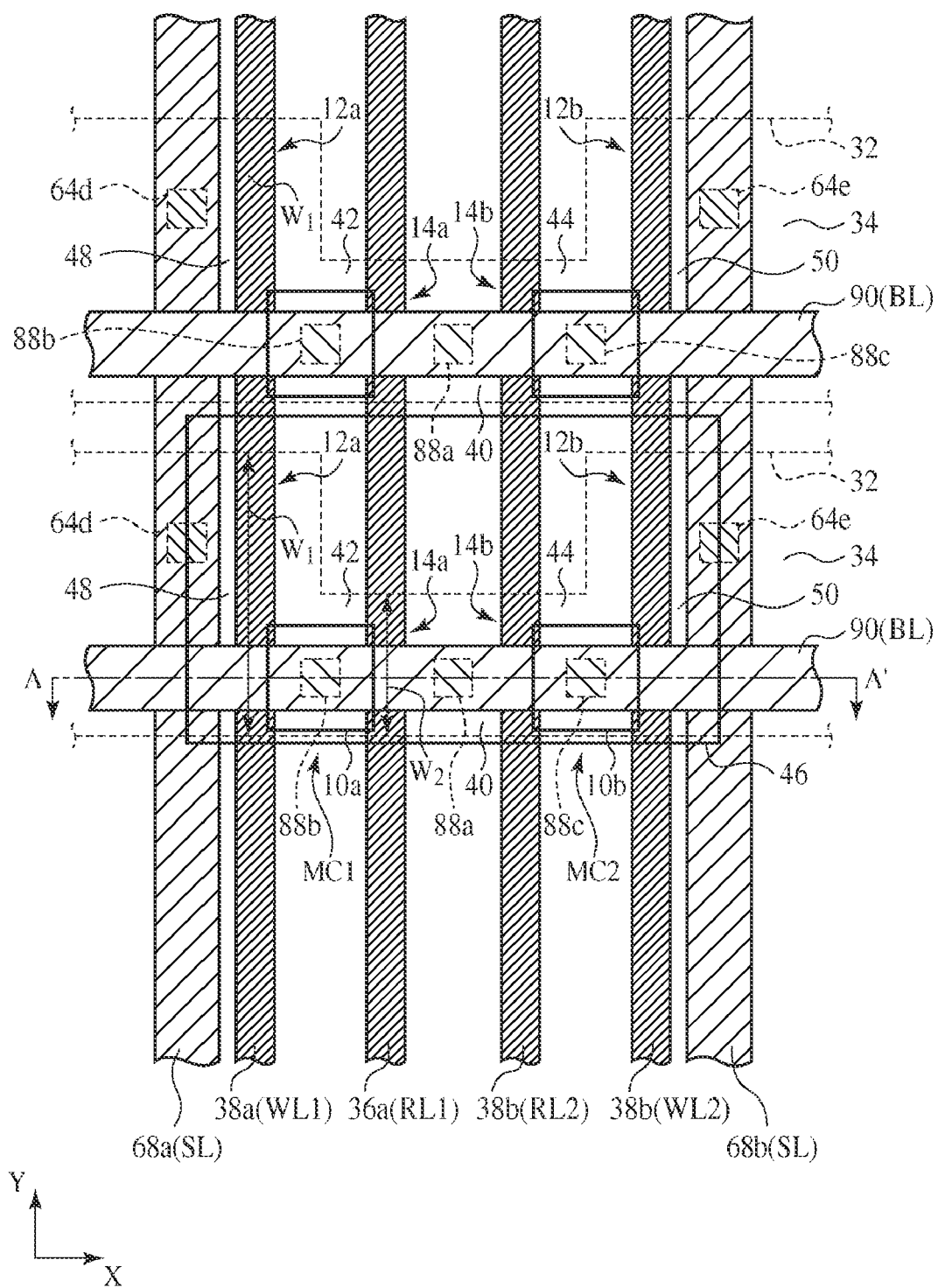
FIG. 4 is a plan view of the nonvolatile semiconductor memory device according to the first embodiment.

The structure of the nonvolatile semiconductor memory device according to the present embodiment will be explained with reference to FIGS. 3 and 4. FIG. 3 is a sectional view of the nonvolatile semiconductor memory device according to the present embodiment, which illustrates the structure thereof. FIG. 4 is a plan view of the nonvolatile semiconductor memory device according to the present embodiment. FIG. 3 is the sectional view along the line A-A' in FIG. 4.

On a semiconductor substrate 30, device isolation regions 32 for defining device regions are formed. Each device region 34 has a relatively larger width $W_1$ in the region where the first transistor 12 is formed and has a relatively smaller width $W_2$ in the region where the second transistor 14 is formed.

On the semiconductor substrate 30 with the device regions 34 defined, a plurality of reset lines RL1, RL2 are formed in parallel with each other. The reset lines RL1, RL2 are extended in the Y-direction. The reset line RL1 functions also as the gate electrode 36a of the second transistor 14a of a first memory cell MC1. The reset line RL2 functions also as the gate electrode 36b of the second transistor 14b of the second memory cell MC. Since the reset lines RL1, RL2 are formed on the relatively smaller width-regions 34, the gate width $W_2$ of the second transistors 14a, 14b is relatively smaller.

In the drawing, the left side of the reset line RL1, a word line WL1 is formed, and a word line WL2 is formed on the right side of the reset line RL2. The word lines WL1, WL2 are formed in parallel with the reset lines RL1, RL2 and extended in the Y-direction. The word line WL1 functions also as the gate electrode 38a of the first transistor 12a of the first memory cell MC1. The word line WL2 functions also as the gate electrode 38b of the second transistor 14b of the second memory cell MC2. Since the word lines WL1, WL2 are formed on the relatively larger width-device regions 34, and the gate width $W_1$ of the first transistors 12a, 12b are relatively larger. The gate width $W_1$ of the first transistors 12a, 12b is larger than the gate width $W_2$ of the second transistors 14a, 14b. The gate width $W_1$ of the first transistors 12a, 12b is set larger than the gate width $W_2$ of the second transistors 14a, 14b because the on-resistance of the second transistors 14a, 14b is set larger than the on-resistance of the first transistors 12a, 12b.

In the device region 34 on both sides of the reset line RL1, source/drain diffused layers 40, 42 are formed. The gate electrode 36a functioning also as the reset line RL1, and the source/drain diffused layers 40, 42 form the second transistor 14a of the first memory cell MC1.

In the device region 34 on both sides of the reset line RL2, the source/drain diffused layer 40, 44 are formed. The gate electrode 36b functioning also as the reset line RL2, and the source/drain diffused layers 40, 44 form the second transistor 14b of the second memory cell MC2.

One source/drain diffused layer 40 of the second transistor 14a of the first memory cell MC1 and one source/drain diffused layer 40 of the second transistor 14b of the second memory cell MC2 are formed of the common source/drain diffused layer 40. In the present embodiment, one source/drain diffused layer 40 of the second transistor 14a of the first memory cell MC1 and one source/drain diffused layer 40 of the second transistor 14b of the second memory cell MC2 are formed of the common source/drain diffused layer 40, whereby a space 46 required to form the memory cells MC1, MC2 can be small.

The gate electrode 38a functioning also as the word line WL1, and the source/drain diffused layers 42, 48 form the first transistor 12a of the first memory cell MC1. One source/drain diffused layer 42 of the first transistor 12a of the first memory cell MC1 and the other source/drain diffused layer 42 of the second transistor 14a of the first memory cell MC1 are formed of the common source/drain diffused layer 42.

The gate electrode 38b functioning as the word line WL2, and the source/drain diffused layers 44, 50 form the first transistor 12b of the second memory cell MC2. One source/drain diffused layer 44 of the first transistor 12b of the second memory cell MC2 and the other source/drain diffused layer 44 of the second transistor 14b of the second memory cell MC2 are formed of the common source/drain diffused layer 44.

An inter-layer insulation film 52 is formed on the semiconductor substrate 30 with the first transistors 12a, 12b and the second transistors 14a, 14b formed on. In the inter-layer insulation film 52, a contact plug 58a coupled to the source/drain diffused layer 40, a contact plug 58b coupled to the source/drain diffused layer 42, a contact plug 58c coupled to the source/drain diffused layer 44, a contact plugs 58d coupled to the source/drain diffused layer 48 and a contact plug 58e coupled to the source/drain diffused layer 50 are buried.

On the inter-layer insulation film 52, a relay interconnection 60a electrically coupled to the source/drain diffused layer 40 via the contact plug 58a, a relay interconnection 60b electrically coupled to the source/drain diffused layer 42 via the contact plug 58b, a relay interconnection 60c electrically coupled to the source/drain diffused layer 44 via the contact plug 58c, a relay interconnection 60d electrically coupled to the source/drain diffused layer 48 via the contact plug 60d, and a relay interconnection 60e electrically coupled to the source/drain diffused layer 50 via the contact plug 58e are formed.

On the inter-layer insulation film 52 with the relay interconnections 60a-60e formed on, an inter-layer insulation film 62 is formed. In the inter-layer insulation film 62, contact plugs 64a-64e coupled respectively to the relay interconnections 60a-66e are buried.

On the inter-layer insulation film 62 with the relay interconnections 60a-60e and the contact plugs 60a-60e buried in, relay interconnections 66a-66c coupled respectively to the contact plugs 64a-64c are respectively formed. On the inter-layer insulation film 62, a source line 68a(SL) coupled to the contact plug 64d and a source line 68b(SL) coupled to the contact plug 64e are formed. The source lines 68a, 68b are formed in parallel with the word lines WL1, WL2 and are extended in the Y-direction.

On the inter-layer insulation film 62 with the source lines 68a, 68b and the relay interconnections 66a-66c formed on, an inter-layer insulation film 70 is formed. In the inter-layer insulation film 70, contact plugs 72a-72c coupled respectively to the relay interconnections 66a-66c are buried.

On the inter-layer insulation film 70 with the contact plugs 72a-72c buried in, relay interconnections 74a-74c coupled respectively to the contact plugs 72a-72c are formed.

The relay interconnections 74a-74c are buried by an inter-layer insulation film 76.

On the inter-layer insulation film 76 with the relay interconnections 74a-74c buried in, resistance memory elements 10a, 10b are formed. The resistance memory element 10a each includes a lower electrode 80 electrically coupled to a source/drain diffused layer 42 via the relay interconnections 74b, etc., a resistance memory layer 82 of a resistance memory material formed on the lower electrode 80, and an upper electrode 84 formed on the resistance memory layer 82. The resistance memory element 10b each includes a lower electrode 80 electrically coupled to a source/drain diffused layer 44 via the relay interconnections 74c, etc., the resistance memory layer 82 of the resistance memory material formed on the lower electrode 80, and an upper electrode 84 formed on the resistance memory layer 82.

On the inter-layer insulation film 76 with the resistance memory elements 10a, 10b formed on, an inter-layer insulation film 86 is formed. In the inter-layer insulation film 86, a contact plug 88a coupled to the relay interconnection 74a is buried. In the inter-layer insulation film 86, a contact plug 88b coupled to the upper electrode 84 of the resistance memory element 10a is buried. In the inter-layer insulation film 86, a contact plug 88b coupled to the upper electrode 84 of the resistance memory element 10b is buried.

On the inter-layer insulation film 86 with the contact plugs 88a-88c buried in, a bit line 90(BL) is formed. The bit line 90 is extended in the X-direction. The bit line 90 is electrically coupled to the upper electrode 84 of the resistance memory element 10a via the contact plug 88b. The bit line 90 is electrically coupled to the upper electrode 84 of the resistance memory element 10b via the contact plug 88c. The bit line 90 is electrically coupled to the source/drain diffused layer 40 via the contact plug 88a, the relay interconnection 74a, the contact plug 72a, the relay interconnection 66a, the contact plug 64a, the relay interconnection 60a and the contact plug 58a.

Thus, the nonvolatile semiconductor memory device according to the present embodiment is constituted.

(Method for Manufacturing the Nonvolatile Semiconductor Memory Device)

The method for manufacturing the nonvolatile semiconductor memory device according to the present embodiment will be explained with reference to FIGS. 5A to 8B. FIGS. 5A to 8B are sectional views of the nonvolatile semiconductor memory device according to the present embodiment in the steps of the method for manufacturing the nonvolatile semiconductor memory device, which illustrate the method.

First, in the semiconductor substrate 30, the device isolation regions 32 (see FIG. 4) for defining the device regions 34 (see FIG. 4) are formed by, e.g., STI (Shallow Trench Isolation). The semiconductor substrate 30 is, e.g., a silicon substrate.

Figure 5A:
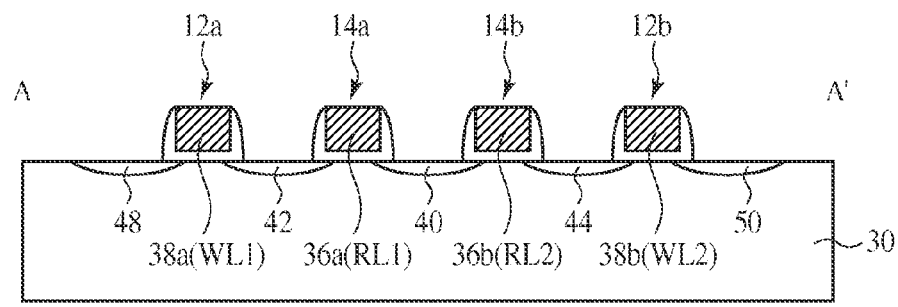
FIGS. 5A to 8B are sectional views of the nonvolatile semiconductor memory device according to the first embodiment in the steps of the method for manufacturing the nonvolatile semiconductor memory device, which illustrate the method.

Next, on the semiconductor substrate 30 in each device region 34, in the same way as by the usual MOS transistor manufacturing method, the first transistor 12a including the gate electrode 38a and the source/drain diffused layers 42, 48, the first transistor 12b including the gate electrode 38b and the source/drain diffused layers 44, 50, the second transistor 14a including the gate electrode 36a and the source/drain diffused layers 40, 42, and the second transistor 14b including the gate electrode 36b and the source/drain diffused layers 40, 44 are formed (see FIG. 5A).

Next, by, e.g., CVD, on the semiconductor substrate 30 with the first transistors 12a, 12b and the second transistors 14a, 14b formed on, a silicon oxide film is formed.

Next, by, e.g., CMP, the surface of the silicon oxide film is planarized. Thus, the inter-layer insulation film 52 of silicon oxide film is formed.

Next, by photolithography, the contact holes 92 are formed in the inter-layer insulation film 52 respectively down to the source/drain diffused layers 40, 42, 44, 48, 50.

Next, by, e.g., CVD, a barrier film and a tungsten film are formed.

Figure 5B:
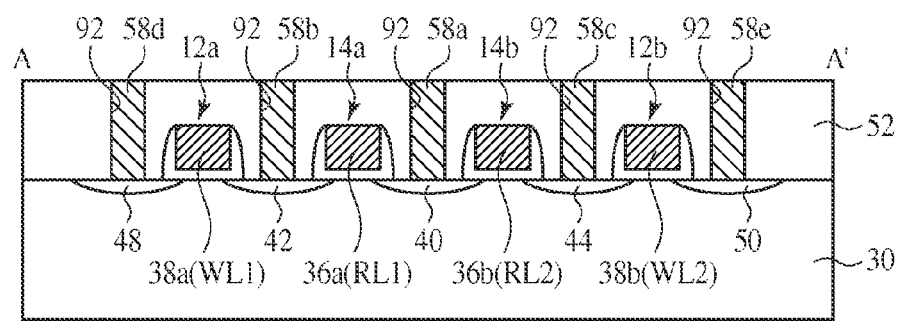
Figure 5C:
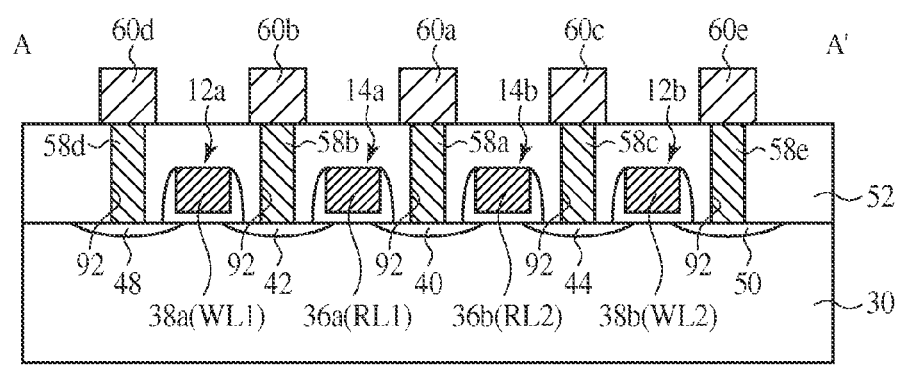

Next, by, e.g., etching back, the contact plugs 58a-58e of tungsten are buried respectively in the contact holes 92 (see FIG. 5B).

Next, on the inter-layer insulation film 52 with the contact plugs 58a-58e buried in, a conduction film is formed by, e.g., CVD.

Next, by photolithography, the conduction film is patterned. Thus, the relay interconnections 60a-60e of the conduction film are formed (see FIG. 5C).

Next, by, e.g., CVD, on the inter-layer insulation film with the relay interconnections formed on, a silicon oxide film is formed.

Next, by, e.g., CMP, the surface of the silicon oxide film is planarized. Thus, the inter-layer insulation film 62 of silicon oxide film is formed.

Next, in the inter-layer insulation film 62, the contact holes 94 respectively down to the relay interconnections 60a-60e are formed by photolithography.

Next, a barrier film and a tungsten film are formed by, e.g., CVD.

Figure 6A:
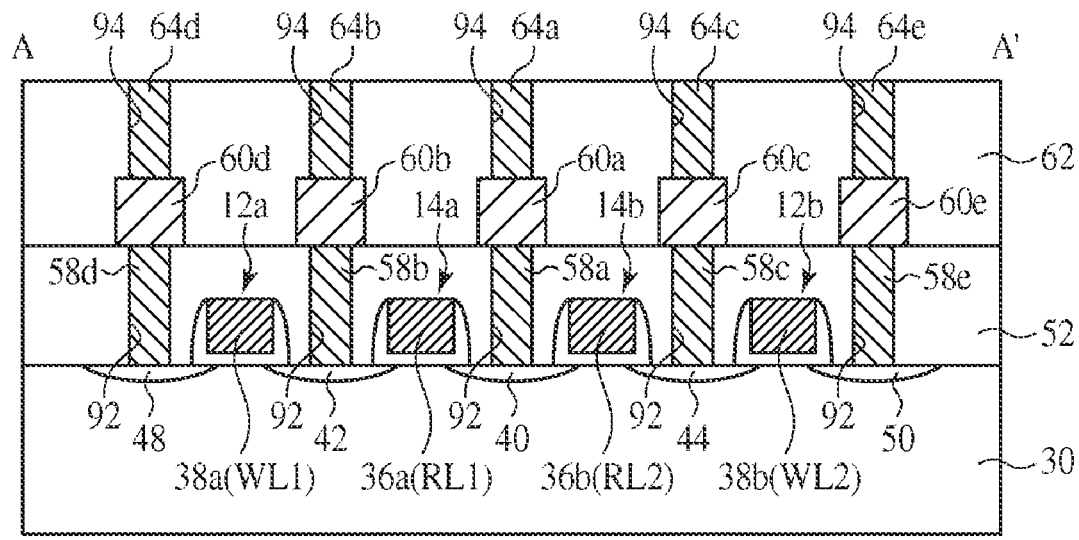

Then, by, e.g., etching back, the contact plugs 64a-64e of tungsten are buried in the contact holes 94 (see FIG. 6A).

Next, on the inter-layer insulation film 62 with the contact plugs 64a-64e buried in, a conduction film is formed by, e.g., CVD.

Next, the conduction film is patterned by photolithography. Thus, the relay interconnections 66a-66c and the source lines 68a, 68b of conduction film are formed.

Next, by, e.g., CVD, a silicon oxide film is formed on the inter-layer insulation film 62 with the relay interconnections 66a-66c and the source lines 68a, 68b formed on.

Next, the surface of the silicon oxide film is planarized by, e.g., CMP. Thus, the inter-layer insulation film 70 of silicon oxide film is formed.

Next, in the inter-layer insulation film 70, the contact holes 96 respectively down to the relay interconnections 66a-66c are formed by photolithography.

Next, a barrier film and a tungsten film are formed by, e.g., CVD.

Figure 6B:
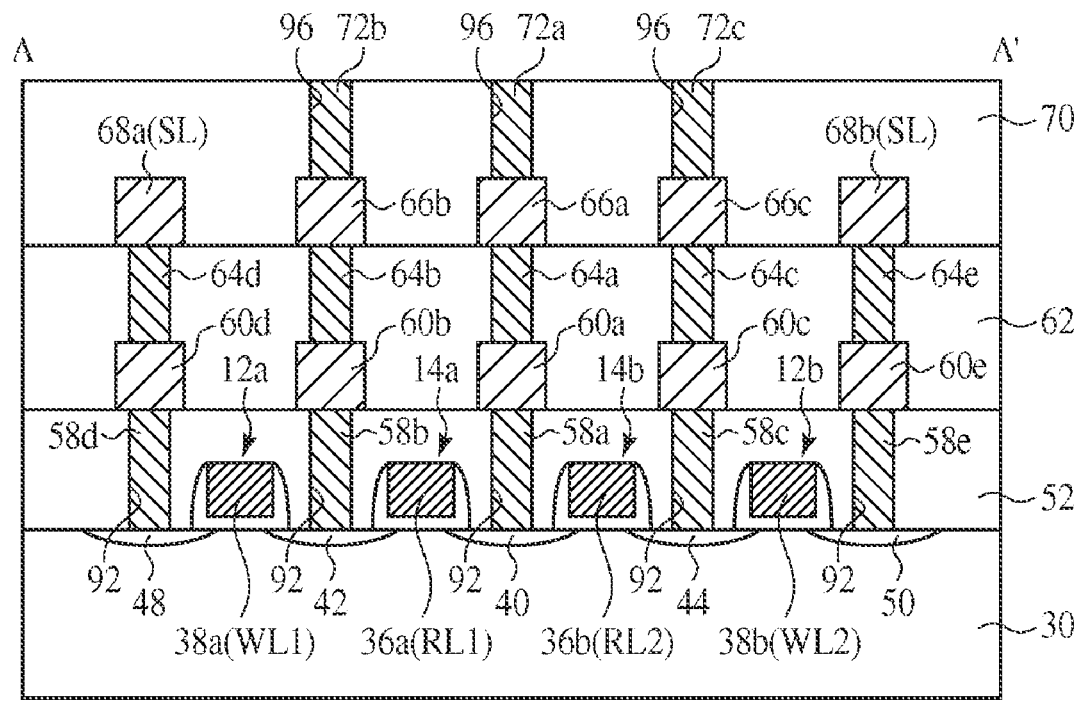
Figure 7A:
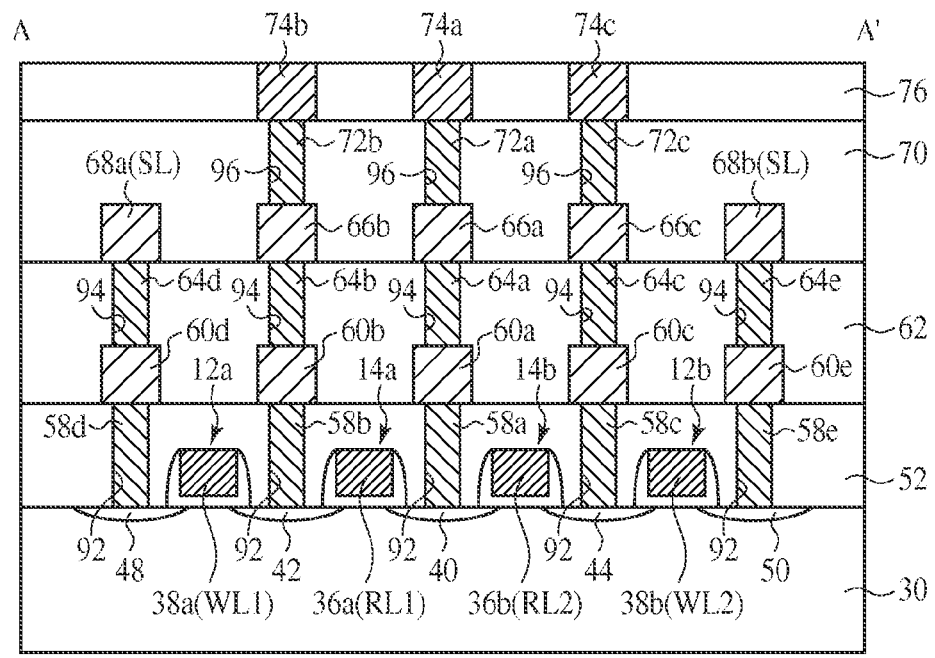
Figure 7B:
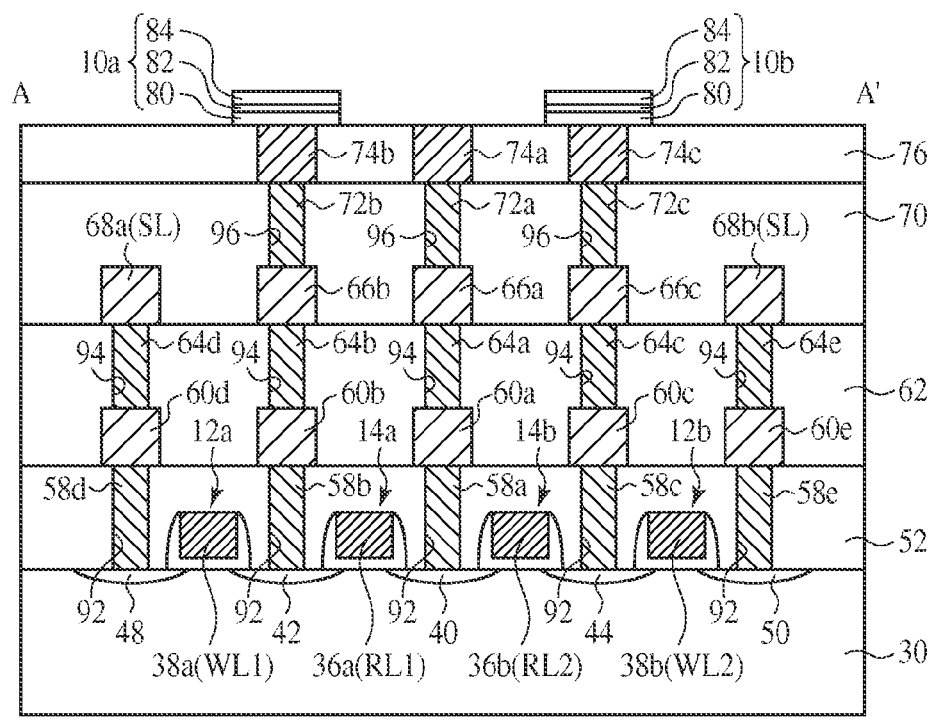
Figure 8A:
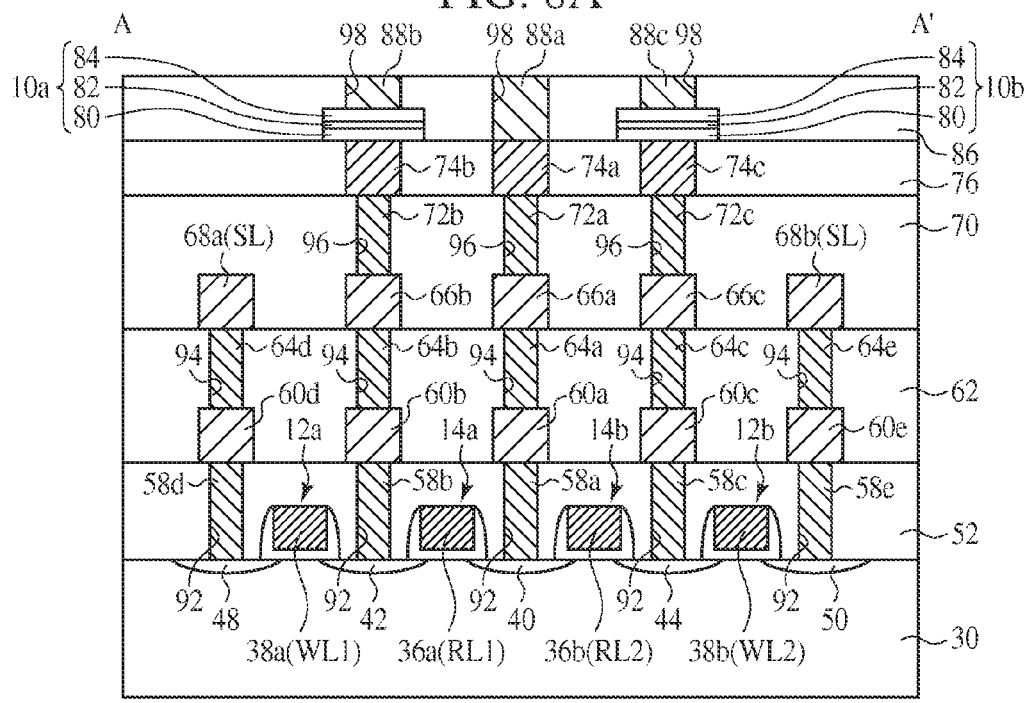
Figure 8B:
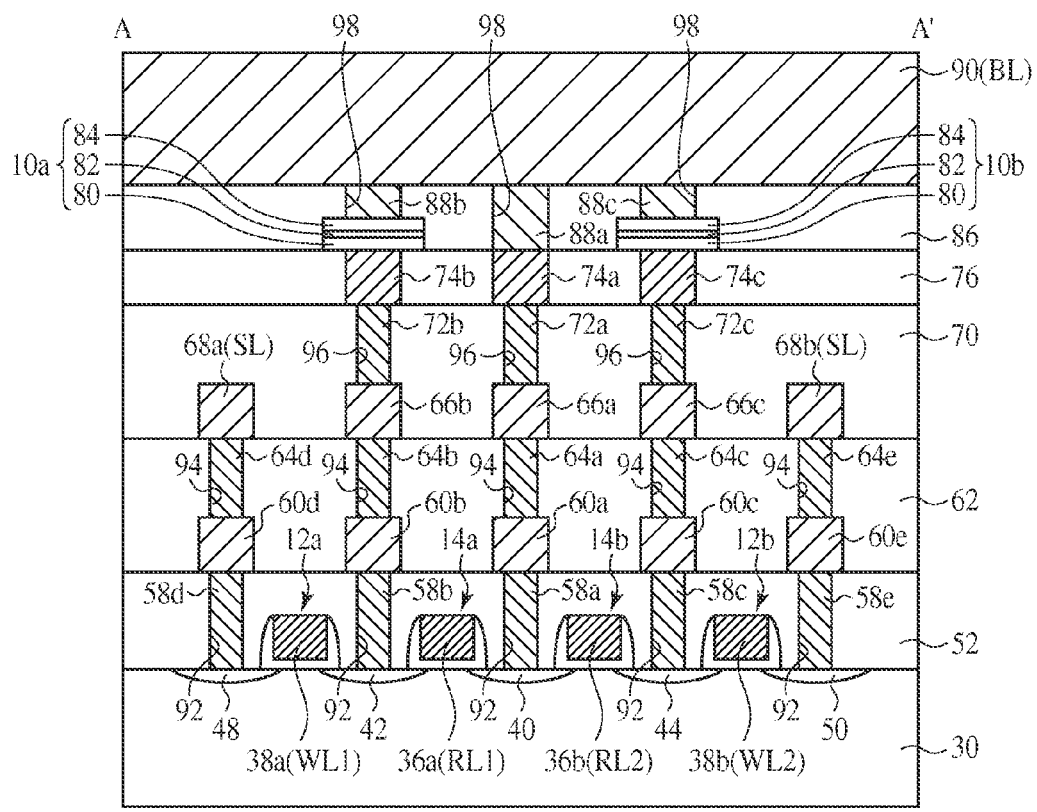

Then, by, e.g., etching back, the contact plugs 72a-72c of tungsten are buried respectively in the contact holes 96 (see FIG. 6B).

Next, on the inter-layer insulation film 70 with the contact plugs 72a-72c buried in, a conduction film is formed by, e.g., CVD.

Next, the conduction film is patterned by photolithography. Thus, the relay interconnections 74a-74c of conduction film are formed (see FIG. 7A).

Then, on the inter-layer insulation film 70 with the relay interconnections 74a-74c formed on, a silicon oxide film is formed by, e.g., CVD.

Next, by, e.g., CMP, the surface of the silicon oxide film is planarized until the surfaces of the relay interconnections 74a-74c are exposed. Thus, the inter-layer insulation film 76 of silicon oxide film is formed.

Then, on the inter-layer insulation film 76 with the relay interconnections 74a-74c buried in, a platinum film, for example, is formed by, e.g., sputtering. The platinum film is to be the lower electrodes 80 of the resistance memory elements 10a, 10b.

Next, a $TiO_x$ film is formed on the platinum film by, e.g., laser ablation, sol-gel process, sputtering, MOCVD or others. The $TiO_x$ film is to be the resistance memory layer 82 of the resistance memory elements.

Then, on the TiO$_x$ film, a platinum film, for example, is formed by, e.g., sputtering. The platinum film is to be the upper electrodes 84 of the resistance memory elements 10a, 10b.

Thus, the layer film of the platinum film, the TiO$_x$ film and the platinum film is formed.

Next, the layer film is patterned by photolithography. Thus, the resistance memory elements 10a, 10b including the lower electrode 80 of platinum film, the resistance memory layer 82 of TiO$_x$ film and the upper electrode 86 of platinum film are formed (see FIG. 7B).

Then, on the inter-layer insulation film 76 with the resistance memory elements 10a, 10b formed on, a silicon oxide film is formed by, e.g., CVD.

Next, the surface of the silicon oxide film is planarized by, e.g., CMP. Thus, the inter-layer insulation film 86 of silicon oxide film is formed.

Next, in the inter-layer insulation film 86, the contact hole 98 arriving at the relay interconnections 74a, and the contact holes 98 respectively arriving at the upper electrodes 84 of the resistance memory elements 10a, 10b are formed by photolithography.

Next, a barrier film and a tungsten film are formed by, e.g., CVD.

Next, by etching back, the contact plugs 88a-88c of tungsten film are buried in the contact holes 98.

Then, on the inter-layer insulation film 86 with the contact plugs 88a-88c buried in, a conduction film is formed by, e.g., sputtering.

Next, the conduction film is patterned by photolithography. Thus, the bit line 90 of conduction film is formed.

Thus, the nonvolatile semiconductor memory device according to the present embodiment is manufactured.

[b] Second Embodiment

Figure 9:
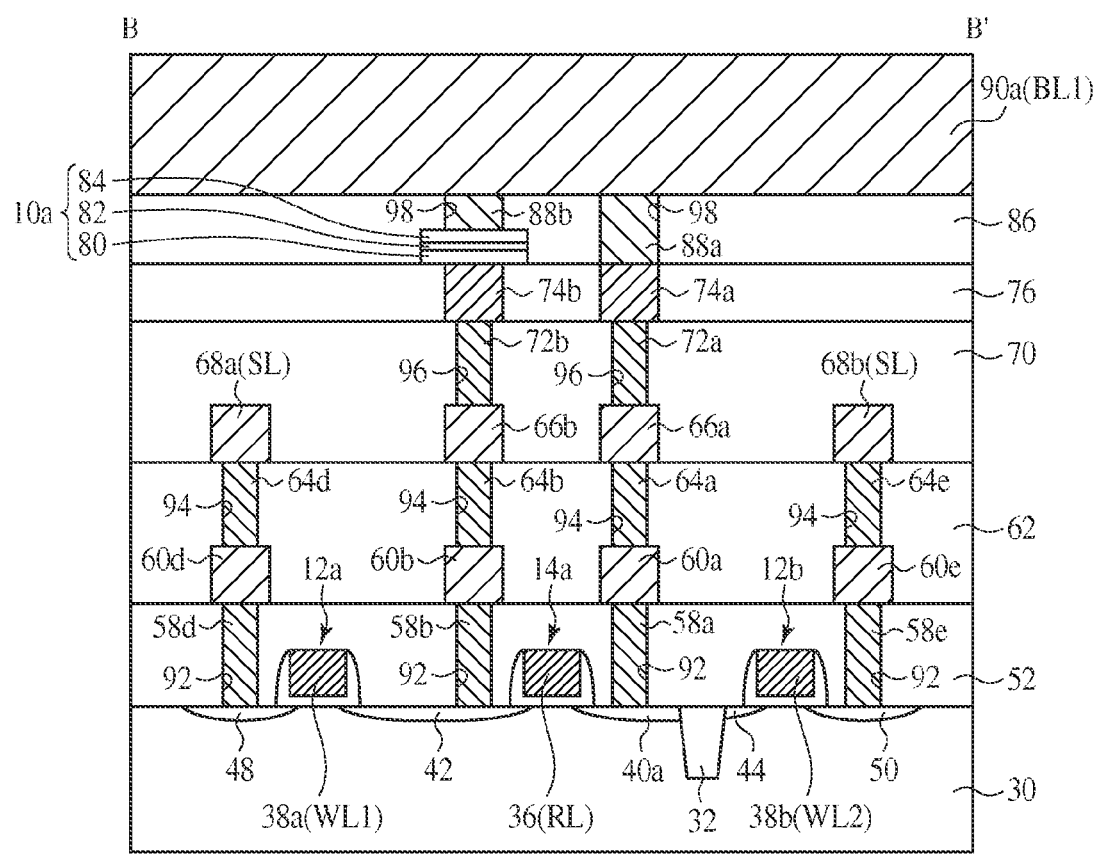
FIG. 9 is a sectional view of the nonvolatile semiconductor memory device according to a second embodiment.
Figure 10:
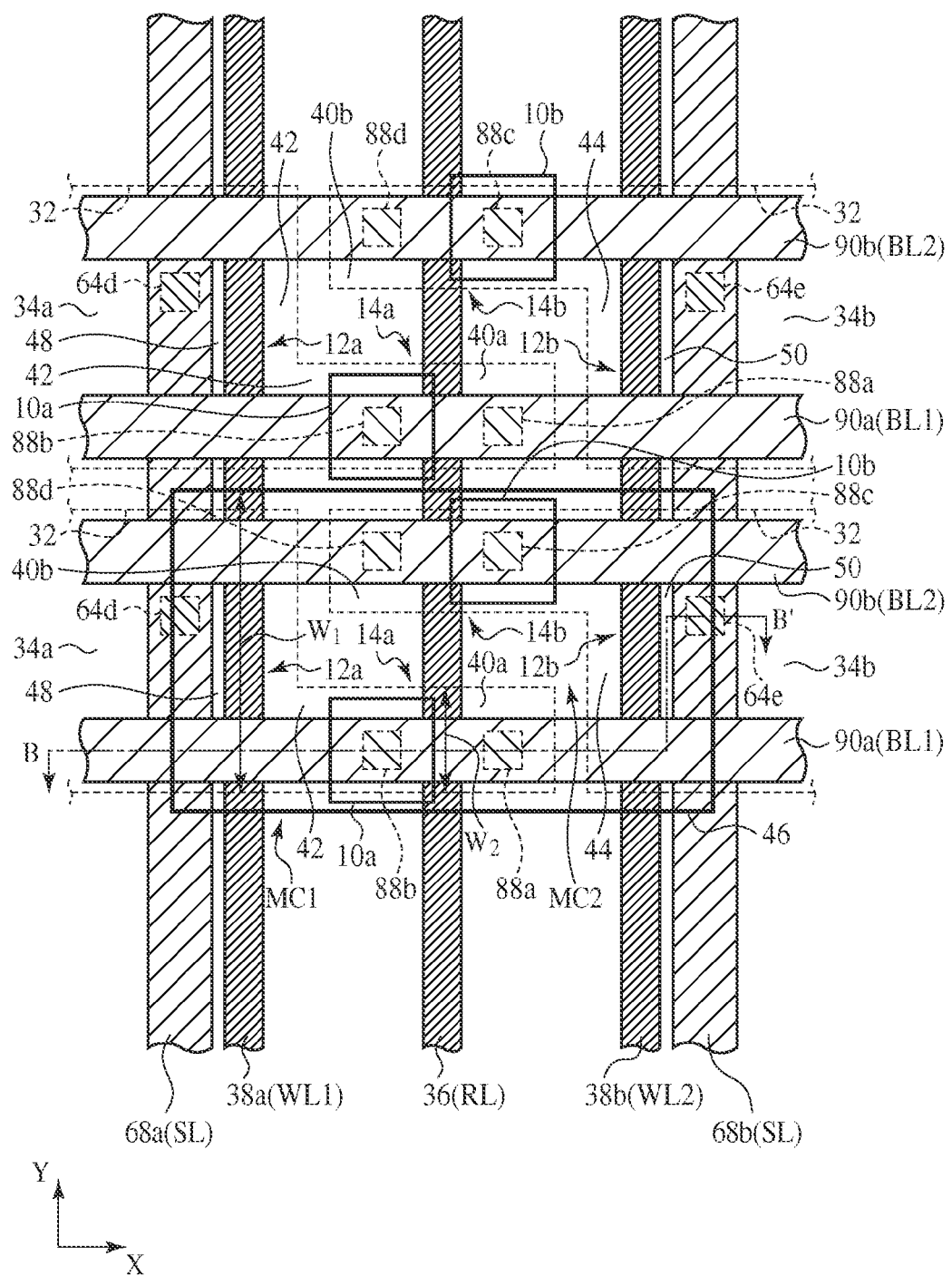
FIG. 10 is a plan view of the nonvolatile semiconductor memory device according to the second embodiment.

The nonvolatile semiconductor memory device according to a second embodiment will be explained with reference to FIGS. 9 and 10. FIG. 9 is a sectional view of the nonvolatile semiconductor memory device according to the present embodiment. FIG. 10 is a plan view of the nonvolatile semiconductor memory device according to the present embodiment. FIG. 9 is the sectional view along the line B-B' in FIG. 10. The same members of the present embodiment as those of the nonvolatile semiconductor memory device according to the first embodiment, and the writing method, the reading method and the erasing method of the nonvolatile semiconductor memory device illustrated in FIGS. 1 to 8 are represented by the same reference numbers not to repeat or to simplify their explanation.

The nonvolatile semiconductor memory device according to the present embodiment is characterized mainly in that the gate electrodes 36 of the second transistors 14a, 14b of memory cells MC1, MC2 neighboring each other are coupled by a common reset line 36(RL).

On a semiconductor substrate 30, device isolation regions 32 for defining device regions 34a, 34b are formed. On the device region 34a, a first memory cell MC1 is formed, and a second memory cell MC2 are formed on the device region 34b. The width of the device regions 34a, 34b is relatively larger in the regions where the first transistors 12a, 12b are formed and the device regions 34a, 34b is relatively smaller in the region where the second transistors 14a, 14b are formed.

On the semiconductor substrate 30 with the device isolation regions 32 formed on, a reset line 36(RL) is formed. The reset line 36 is extended in the Y-direction. The reset line 36 functions also as the gate electrodes of the second transistors 14a, 14b. The rest line 36 is formed in the relatively smaller-width device regions 34a, 34b, and the gate width $W_2$ of the second transistors 14a, 14b is relatively smaller.

In the drawing, on the left sides of the reset line 36, a word line 38a(WL1) is formed, and a word line 38b(WL2) is formed on the right side of the rest line 36 (see FIG. 10). The word lines 38a, 38b are formed in parallel with the reset line 36 and are extended in the Y-direction. The word lines 38a, 38b respectively function also as the gate electrodes of the first transistors 12a, 12b. Since the word lines 38a, 38b are formed in the relatively larger-width device region 34a, 34b, the gate width $W_1$ of the first transistors 12a, 12b is relatively larger. The gate width $W_1$ of the first transistors 12a, 12b is larger than the gate width $W_2$ of the second transistors 14a, 14b. The gate width $W_1$ of the first transistors 12a, 12b is made larger than the gate width $W_2$ of the second transistors 14a, 14b so as to set the on-resistance of the second transistors 14a, 14b larger than the on-resistance of the first transistors 12a, 12b.

In the device region 34a on both sides of the reset line 36, source/drain diffused layers 40a, 42 are formed. The gate electrode, which functions also as the reset line 36, and the source/drain diffused layers 40a, 42 form the second transistor 14a of the first memory cell MC1.

In the device region 34b on both sides of the reset line 36, source/drain diffused layers 40b, 44 are formed. The gate electrode, which functions also as the reset line 36, the source/drain diffused layers 40b, 44 form the second transistor 14b of the second memory cell MC2.

The gate electrode of the second transistor 14a of the first memory cell MC1 and the gate electrode of the second transistor 14b of the second memory cell MC2 are formed by the common reset line 36.

According to the present embodiment, the gate electrode of the second transistor 14a of the first memory cell MC1 and the gate electrode of the second transistor 14b of the second memory cell MC2 are formed by the common reset line 36, whereby the space 46 necessary to form the memory cells MC1, MC2 can be made small.

On the inter-layer insulation film 86, a plurality of bit lines 90a(BL), 90b(BL2) are formed in parallel with each other. The first bit line 90a and the second bit line 90b are extended in the X-direction.

The first bit line 90a is electrically coupled to the upper electrode 84 of the resistance memory element 10a of the first memory cell MC1 via the contact plug 88b. The first bit line 90a is electrically coupled to the source/drain diffused layer 40a of the second transistor 14a of the first memory cell MC1 via the contact plug 88a, etc.

The second bit line 90b is electrically coupled to the upper electrode 84 of the resistance memory element 10b of the second memory cell MC2 via the contact plug 88c. The second bit line 90b is electrically coupled to the source/drain diffused layer 40b of the second transistor 14b of the second memory cell MC2 via the contact plug 88d, etc.

Thus, the nonvolatile semiconductor memory device according to the present embodiment is constituted.

The nonvolatile semiconductor memory device according to the present embodiment can write, read and erase by the writing method, the reading method and the erasing method of the nonvolatile semiconductor memory device according to the first embodiment.

As described above, the gate electrodes 36 of the second transistors 14a, 14b of the memory cells MC1, MC2 neighboring to each other may be coupled by the common reset line 36(RL). According to the present embodiment as well, the space 46 required to form the memory cells can be made small, which can contribute to downsizing the nonvolatile semiconductor memory device.

[c] Third Embodiment

Figure 11:
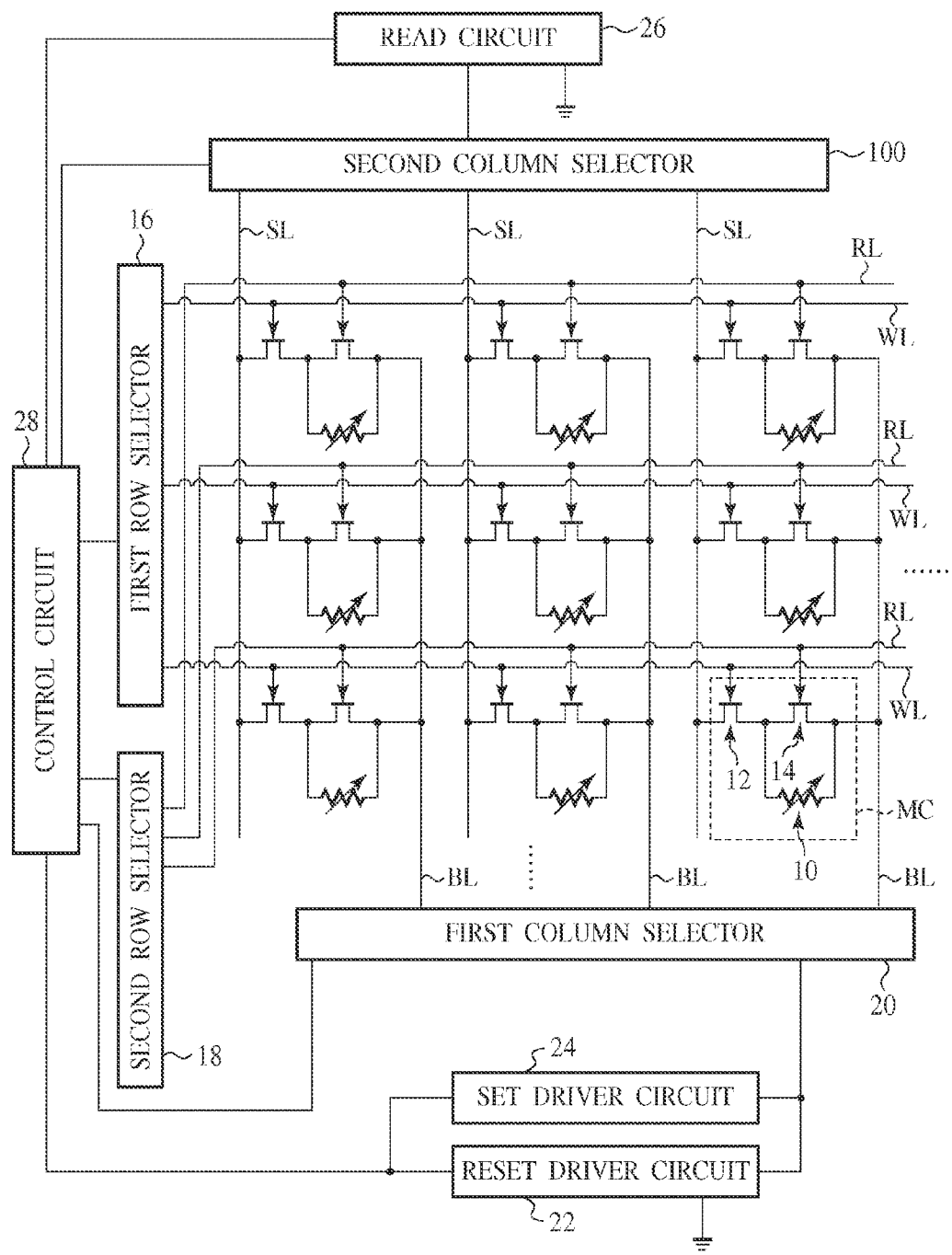
FIG. 11 is a circuit diagram of the nonvolatile semiconductor memory device according to a third embodiment.
Figure 12:
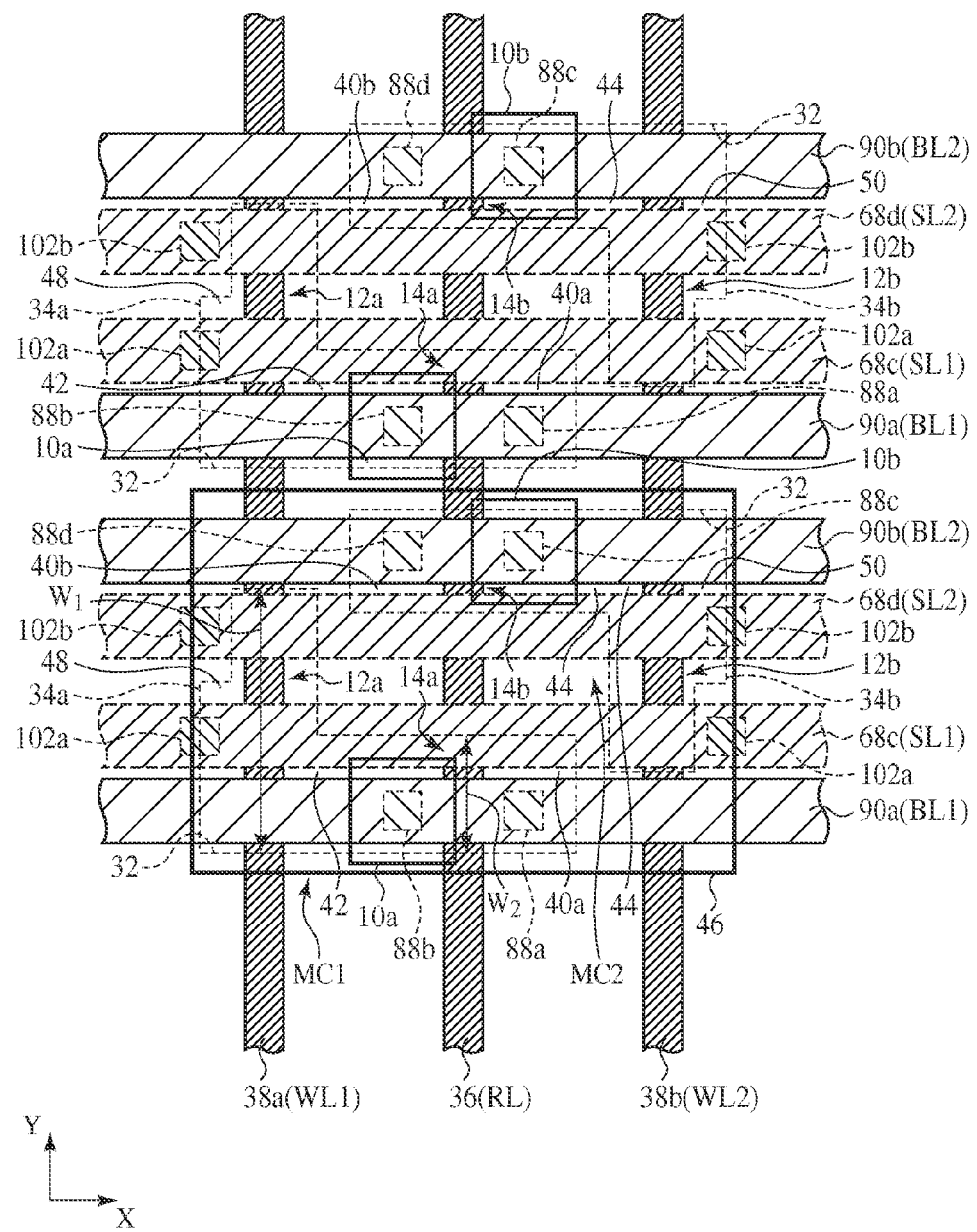
FIG. 12 is a plan view of the nonvolatile semiconductor memory device according to the third embodiment.

The nonvolatile semiconductor memory device according to a third embodiment, and the writing method, the reading method and the erasing method of the nonvolatile semiconductor memory device will be explained with reference to FIGS. 11 and 12. FIG. 11 is a circuit diagram of the nonvolatile semiconductor device according to the present embodiment. FIG. 12 is a plan view of the nonvolatile semiconductor memory device according to the present embodiment. The same members of the present embodiment as those of the nonvolatile semiconductor memory device according to the first or the second embodiment, and the writing method, the reading method and the erasing method of the nonvolatile semiconductor memory device illustrated in FIGS. 1 to 10 are represented by the same reference numbers not to repeat or to simplify their explanation.

The nonvolatile semiconductor memory device according to the present embodiment is characterized mainly in that the source terminal of the first transistor 12 is coupled to a source line, and the potential of the source line is controlled by the second column selector.

(Nonvolatile Semiconductor Memory Device)

The nonvolatile semiconductor memory device according to the present embodiment will be explained with reference to FIGS. 11 and 12.

As illustrated in FIG. 11, memory cells MC each including a resistance memory element 10, the first transistor 12 and the second transistor 14 are arranged in a matrix.

A word line commonly connects the gate electrodes of the first transistors 12 of the memory cells present in the same row. A plurality of the word lines WL are coupled to the first row selector 16. The first row selector 16 is for applying a prescribed voltage to the word line WL to which a memory cell MC to be selected is coupled.

Each reset line commonly connects the gate electrodes of the second transistors 14 of the memory cells MC present in the same row. The reset line is formed in parallel with the word line WL. A plurality of the reset lines RL are coupled to the second row selector 18. The second row selector 18 is for applying a prescribed voltage to the reset line RL coupled to a memory cell MC to be selected.

Each bit line BL commonly connects one ends of the resistance memory elements 10 and the one (drain terminals) of the source/drain diffused layers of the second transistors 14 of the memory cells MC present in the same column. The bit lines BL are formed, intersecting the word lines WL and the reset lines RL. A plurality of the bit lines BL are coupled to the first column selector 20. The first column selector 20 is for applying a prescribed voltage to the bit line BL coupled to a memory cell MC to be selected and grounding the bit line BL coupled to the memory cell MC to be selected. To the first column selector 20, a set driver circuit 24 and a reset driver circuit 22 are coupled.

Each source line SL commonly connects one ends (source terminals) of the source/drain diffused layers of the first transistors 12 of the memory cells MC present in the same column.

As illustrated in FIG. 12, the first source line 68c(SL1) is formed in parallel with the first bit line 90a(BL1). The second source line 68d(SL2) is formed in parallel with the second bit line 90b(BL2). The first source line 68c and the second source line 68d are extended in the Y-direction. The first source line 68c is electrically coupled to the source/drain diffused layer 48 of the first transistor 14a of the memory cell MC1 via the contact plug 102a. The second source line 68d is electrically coupled to the source/drain diffused layer 50 of the second transistor 14b of the memory cell MC2 via the contact plug 102b.

As illustrated in FIG. 11, a plurality of the source lines SL are coupled to the second column selector 100. The second column selector 100 is for ground the source line SL coupled to the memory cell MC to be selected and applying a prescribed voltage to the source line SL coupled to the memory cell MC to be selected. To the second column selector 100, a read circuit 26 is coupled.

The set driver circuit 24 is for applying a prescribed voltage to a bit line BL when the resistance memory element 10 is set, i.e., the resistance memory element 10 is changed from the high resistance state into the low resistance state.

The reset driver circuit 22 is for applying a prescribed voltage to a bit line BL when the resistance memory element 10 is reset, i.e., the resistance memory element 10 is changed from the low resistance state into the high resistance state.

The read circuit 26 includes a sense amplifier. The read circuit 26 read information written in the memory cells MC, based on a current flowing in the source lines SL.

The first row selector 16, the second row selector 18, the first column selector 20, the second column selector 100, the set driver circuit 24, the reset driver circuit 22 and the read circuit 26 are coupled to a control circuit 28 which controls the whole.

Thus, the nonvolatile semiconductor memory device according to the present embodiment is constituted.

Then, the writing method, the reading method and the erasing method of the nonvolatile semiconductor memory device according to the present embodiment will be explained.

(Writing Method)

The reset of the resistance memory elements 10, i.e., writing the high resistance state into the resistance memory elements 10 will be explained.

When the high resistance state is written in a resistance memory element 10, the word line WL coupled to a memory cell to be written is selected by the first row selector 16. Specifically, the first row selector 16 applies a prescribed voltage to the word line WL coupled to the memory cell MC to be written. Thus, the first transistor 12 of the memory cell MC to be written is turned on-state.

The reset line RL coupled to the memory cell MC to be written is selected by the second row selector 100. Specifically, the second row selector 18 applies a prescribed voltage to the reset line RL coupled to the memory cell MC to be written. Thus, the second transistor 14 of the memory cell MC to be written is turned on.

The source line SL coupled to the memory cell MC to be written is selected by the second column selector 100. Specifically, the source line SL coupled to the memory cell MC to be written is grounded by the second column selector 100.

Next, the bit line BL coupled to the memory cell MC to be written is selected by the first column selector 20. Thus, the bit line BL selected by the first column selector 20 is coupled to the reset driver circuit 22. The reset driver circuit 22 applies a prescribed voltage to the selected bit line BL for a prescribed period of time.

Thus, the high resistance sate is written in the resistance memory element 10 of the memory cell MC to be written. In the present embodiment as well, the second transistors 14 are coupled to the resistance memory elements 10 in parallel, and the second transistors 14 are on-state when the high resistance state is written in the resistance memory elements 10, whereby the application of a voltage higher than the set voltage to the resistance memory elements 10 which have been changed into the high resistance state can be prevented. Thus, according to the present embodiment as well, the resistance memory elements 10 which have been changed from the low resistance state into the high resistance state can be prevented from returning to the low resistance state, and the normal write operation can be made.

Then, the set of the resistance memory elements 10, i.e., writing the low resistance state into the resistance memory elements 10 will be explained.

When the low resistance state is written in the resistance memory element 10, the word line WL coupled to the memory cell MC to be written is selected by the first row selector 16. Specifically, the first row selector 16 applies a prescribed voltage to the word line WL coupled to the memory cell MC to be written. Thus, the first transistor 12 of the memory cell MC to be written is turned on.

No voltage is applied to the reset line RL coupled to the memory cell MC to be written. Thus, the second transistor 14 of the memory cell MC to be written is off-state.

The source line SL coupled to the memory cell MC to be written is selected by the second column selector 100. Specifically, the second column selector 100 grounds the source line SL coupled to the memory cell MC to be written.

Then, the bit line BL coupled to the memory cell MC to be written is selected by the first column selector 20. Thus, the bit line BL selected by the first column selector 20 is coupled to the set driver circuit 24. The set driver circuit 24 applies a prescribed voltage to the selected bit line BL. The period of time of applying the prescribed voltage to the selected bit line BL is e.g., about several nanoseconds.

The low resistance state is written in the memory cell MC to be written.

(Reading Method)

The reading method of the nonvolatile semiconductor memory device according to the present embodiment will be explained.

When information written in the resistance memory elements 10 of the memory cells MC, the word line WL coupled to a memory cell MC to be read is selected by the first row selector 16. Specifically, the first row selector 16 applies a prescribed voltage to the word line WL coupled to the memory cell MC to be read. Thus, the first transistor 12 of the memory cell MC to be read is tuned on-state.

No voltage is applied to the reset line RL coupled to the memory cell MC to be read. Accordingly, the second transistor 14 of the memory cell MC to be read is off.

The bit line BL coupled to the memory cell MC to be read is selected by the first column selector 20. Specifically, the bit line BL coupled to the memory cell MC to be read is grounded.

Next, the source line SL coupled to the memory cell MC to be read is selected by the second column selector 100. Thus, the source line SL selected by the second column selector 100 is coupled to the read circuit 26. When the high resistance state is written in the resistance memory element 10 of the memory cell MC to be read, a relatively small current flows in the source line SL. On the other hand, when the low resistance state is written in the resistance memory element 10 of the memory cell MC to be read, a relatively large current flows in the source line SL. The read circuit 26 detects the current flowing in the source line SL by the sense amplifier to judge whether the resistance memory element 10 has the low resistance state or the high resistance state. That is, the read circuit 26 reads information written in the resistance memory elements 10, based on the currents flowing in the source lines.

In the present embodiment, information written in the resistance memory elements 10 is read, based on the currents flowing the source lines SL for the following reason. That is, to each bit line BL, the resistance memory elements 10 of a memory cell MC to be read and also the resistance memory elements 10, etc. of all the memory cells MC present in the same column as the memory cell MC to be read are coupled. Accordingly, a large parasitic capacitance is present in the bit line BL, which often makes the high-speed read impossible. From the source line SL, however, the resistance memory elements 10 of the memory cells MC except the memory cell MC to be read are electrically disconnected by the first transistors 12. Accordingly, the parasitic capacitance of the source line SL is small. Thus, high-speed read is made possible by reading information written in the resistance memory elements 10, based on the currents flowing in the source lines SL. For such reason, in the present embodiment, information written in the resistance memory elements 10 is read, based on the currents flowing in the source lines SL.

The reading is explained here with the second transistor 14 of a memory cell MC to be read turned off. However, the reading can be made with the second transistor 14 of a memory cell MC to be read turned on-state. In this case, the voltage to be applied to the gate terminal of the second transistor 14 can be suitably set. The read is made with the second transistors 14 turned on-state, so that, as described above, reading with the second transistor 14 turned on-state can prevent read errors.

(Erasing Method)

The erasing method of the nonvolatile semiconductor memory device according to the present embodiment will be explained.

Information written in the resistance memory elements 10 of the memory cells MC present in the same column can be block erased as follows.

That is, all the word lines WL are selected by the first row selector 16. Specifically, the first row selector 16 applies a prescribed voltage to all the word lines WL. Thus, the first transistors 14 of all the memory cells MC are turned on-state.

All the reset lines RL are selected by the second row selector 18. Specifically, the second row selector 18 applies a prescribed voltage to all the reset lines RL. Thus, the second transistors 14 of all the memory cells MC are turned on-state.

The source lines SL coupled to the memory cells MC of the column to be erased are selected by the second column selector 100. Thus, the source lines SL selected by the second column selector 100 are grounded.

Then, the bit lines BL coupled to the memory cells MC of the column to be erased are selected by the first column selector 20. Thus, the bit lines BL selected by the first column selector 20 are coupled to the reset driver circuit 22. The reset driver circuit 22 applies a prescribed voltage to the selected bit lines BL.

Thus, information written in the resistance memory elements 10 of the memory cells MC present in the column to be erased is block erased. That is, the high resistance state is block written in the resistance memory elements 10 of the memory cells MC present in the column to be erased.

Information written in the resistance memory elements 10 of all the memory cells MC can be block erased as follows.

That is, all the word lines WL are selected by the first row selector 16. Specifically, the first row selector 16 applies a prescribed voltage to all the word lines WL. Thus, the first transistors 12 of all the memory cells MC are turned on-state.

All the reset lines RL are selected by the second row selector 18. Specifically, the second row selector 18 applies a prescribed voltage to all the reset lines RL. Thus, the second transistors 14 of all the memory cells MC are turned off-state.

All the source lines SL are selected by the second column selector 100. Specifically, the second column selector 100 grounds all the source lines SL.

Next, all the bit lines BL are selected by the first column selector 20. Thus, all the bit lines BL are coupled to the reset driver circuit 22. The reset driver circuit 22 applies a prescribed voltage to all the bit lines BL for a prescribed period of time.

Thus, information written in the resistance memory elements 10 of all the memory cells MC can be block erased. That is, the high resistance state is block written in the resistance memory elements 10 of all the memory cells MC.

Thus, in the nonvolatile semiconductor memory device according to the present embodiment, the source terminals of the first transistors 12 are coupled to the source lines SL, and the potential of the source lines SL is controlled by the second column selector 100, whereby, based on a current flowing in the source lines SL of small parasitic capacitance, information written in the memory cells MC can be read. Thus, according to the present embodiment, information written in the memory cells MC can be read at high speed.

Modified Embodiments

The embodiment is not limited to the above-described embodiments and can cover other various modifications.

For example, in the above-described embodiments, the resistance memory material forming the resistance memory layer 82 is formed of $TiO_x$, but the resistance memory material forming the resistance memory layer 82 is not limited to $TiO_x$. For example, as the resistance memory materials forming the resistance memory layer 82, $NiO_x$, $YO_x$, $CeO_x$, $MgO_x$, $ZnO_x$, $HfO_x$, $WO_x$, $NbO_x$, $TaO_x$, $CrO_x$, $MnO_x$, $AlO_x$, $VO_x$, $SiO_x$, etc. can be used. As the resistance memory materials forming the resistance memory layer, oxide materials containing a plurality of metals and semiconductor atoms, such as $Pr_{1-x}CaMnO_3$, $La_{1-x}CaMnO_3$, $SrTiO_3$, $YBa_2Cu_3O_x$, LaNiO, etc., can be used. These resistance memory materials may be used as a single body or a layer structure.

As the electrode material forming the lower electrodes 80 and the upper electrode 84, platinum is used. The electrode material forming the lower electrodes 80 and the upper electrodes 84 is not limited to platinum. For example, as the electrode material forming the lower electrodes 80 and the upper electrodes 84, Ir, W, Ni, Au, Cu, Ag, Pd, Zn, Cr, Al, Mn, Ta, Si, TaN, TiN, Ru, ITO, NiO, IrO, SrRuO, $CoSi_2$, $WSi_2$, $NiSi$, $MoSi_2$, $TiSi_2$, Al—Si, Al—Cu, Al—Si—Cu, etc. can be used. The electrode material forming the lower electrodes 80 and the electrode material forming the upper electrodes 84 may be the same or different.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A nonvolatile semiconductor memory device comprising:
   a memory cell including
   a resistance memory element which changes from a low resistance state into a high resistance state by application of a voltage which is higher than a reset voltage and lower than a set voltage and changes from the high resistance state into the low resistance state by application of a voltage higher than the set voltage;
   a first transistor including a first gate electrode and a first source/drain diffused layer, and having one end of the first source/drain diffused layer coupled to one end of the resistance memory element; and
   a second transistor including a second gate electrode and a second source/drain diffused layer, and having one end of the second source/drain diffused layer coupled to said one end of the resistance memory element and the other end of the second source/drain diffused layer coupled to the other end of the resistance memory element.

2. The nonvolatile semiconductor memory device according to claim 1, wherein
   an on-resistance value of the second transistor is larger than a resistance value of the resistance memory element in the low resistance state and smaller than a resistance value of the resistance memory element in the high resistance state.

3. The nonvolatile semiconductor memory device according to claim 1, wherein
   an off-resistance value of the second transistor is smaller than a resistance value of the resistance memory element in the high resistance state.

4. The nonvolatile semiconductor memory device according to claim 1, wherein
   the on-resistance value of the second transistor is higher than the on-resistance value of the first transistor.

5. The nonvolatile semiconductor memory device according to claim 4, wherein
   a gate width of the second transistor is smaller than a gate width of the first transistor.

6. The nonvolatile semiconductor memory device according to claim 1, wherein
   a plurality of the memory cells are arranged in a matrix, and said other end of the second source/drain diffused layer of the second transistor of a first memory cell of a plurality of the memory cells, and said other end of the second source/drain diffused layer of the second transistor of a second memory cell of said a plurality of memory cells are common.

7. The nonvolatile semiconductor memory device according to claim 1, wherein
   a plurality of the memory cells are arranged in a matrix, and the nonvolatile semiconductor memory device further comprises:
   a first bit line coupled to said other end of the second source/drain diffused layer of the second transistor of a first memory cell of said a plurality of memory cells;
   a second bit line coupled to said other end of the second source/drain diffused layer of the second transistor of a second memory cell of said a plurality of memory cells, and formed in parallel with the first bit line;
   a reset line formed intersecting the first bit line and the second bit line, and commonly connecting the second gate electrode of the second transistor of the first memory cell and the second gate electrode of the second transistor of the second memory cell; and a first word line formed on one side of the reset line in parallel with the reset line and including the first gate electrode of the first transistor of the first memory cell; and a second word line formed on the other side of the reset line in parallel with the reset line, and including the first gate electrode of the first transistor of the second memory cell.

8. The nonvolatile semiconductor memory device according to claim 1, wherein a plurality of the memory cells are arranged in a matrix, and said nonvolatile semiconductor memory device further comprises:

a plurality of bit lines each commonly connecting said other ends of a plurality of the resistance memory elements present in the same column;

a plurality of word lines each commonly connecting the first gate electrodes of a plurality of the first transistors present in the same row;

a plurality of reset lines formed in parallel with the word lines and each commonly connecting the second gate electrodes of a plurality of the second transistors;

a first column selector coupled to said a plurality of bit lines, for controlling a potential of said a plurality of bit lines;

a first row selector coupled to said a plurality of word lines, for controlling a potential of said a plurality of word lines; and a second row selector coupled to said a plurality of reset lines, for controlling a potential of said a plurality of reset lines, the other ends of the first source/drain diffused layers of said a plurality of first transistors being respectively grounded.

9. The nonvolatile semiconductor memory device according to claim 1, wherein a plurality of the memory cells are arranged in a matrix, and said nonvolatile semiconductor memory device further comprises:

a plurality of the bit lines each commonly connecting said other ends of a plurality of the resistance memory elements present in the same column;

a plurality of the source lines each commonly connecting the other ends of the first source/drain diffused layers of a plurality of the first transistors present in the same column;

a plurality of the word lines each commonly connecting the first gate electrodes of a plurality of the first transistors present in the same row;

a plurality of reset lines formed in parallel with the word lines and commonly connecting the second gate electrodes of a plurality of the second transistors;

a first column selector coupled to said a plurality of bit lines, for controlling a potential of said a plurality of bit lines;

a second column selector coupled to said a plurality of source lines, for controlling a potential of said a plurality of source lines;

a first row selector coupled to said a plurality of word lines, for controlling a potential of said a plurality of word lines; and a second row selector coupled to said a plurality of reset lines, for controlling a potential of said a plurality of reset lines.

10. A writing method of a nonvolatile semiconductor memory device comprising:

a plurality of memory cells each including a resistance memory element which changes from a low resistance state into a high resistance state by application of a voltage which is higher than a reset voltage and lower than a set voltage and changes from the high resistance state into the low resistance state by application of a voltage higher than the set voltage; a first transistor including a first gate electrode and a first source/drain diffused layer, and having one end of the first source/drain diffused layer coupled to one end of the resistance memory element; a second transistor including a second gate electrode and a second source/drain diffused layer, and having one end of the second source/drain diffused layer coupled to said one end of the resistance memory element and the other end of the second source/drain diffused layer coupled to the other end of the resistance memory element;

a plurality of bit lines each commonly connecting said other ends of a plurality of the resistance memory elements present in the same column;

a plurality of word lines each commonly connecting the first gate electrodes of a plurality of the first transistors present in the same row;

a plurality of reset lines formed in parallel with the word lines and commonly connecting the second gate electrodes of a plurality of the second transistors;

a column selector coupled to said a plurality of bit lines, for controlling a potential of said a plurality of bit lines;

a first row selector coupled to said a plurality of word lines, for controlling a potential of said a plurality of word lines; and a second row selector coupled to said a plurality of reset lines, for controlling a potential of said a plurality of reset lines, the other ends of the first source/drain diffused layers of said a plurality of first transistors being respectively grounded, the high resistance state is written into a selected one of the memory cells by applying a voltage selectively to one of the word lines by the first row selector, applying a voltage selectively to one of the reset lines by the second row selector, and applying a voltage selectively to one of the bit lines by the first column selector.

11. The writing method of the nonvolatile semiconductor memory device according to claim 10, wherein the low resistance state is written into the resistance memory element of the selected memory cell by applying a voltage selectively to said one word line by the first row selector, applying no voltage to said one reset line by the second row selector, and applying a voltage selectively to one of the bit lines by the first column selector.

12. A reading method of a nonvolatile semiconductor memory device comprising:

a plurality of memory cells each including a resistance memory element which changes from a low resistance state into a high resistance state by application of a voltage which is higher than a reset voltage and lower than a set voltage and changes from the high resistance state into the low resistance state by application of a voltage higher than the set voltage; a first transistor including a first gate electrode and a first source/drain diffused layer, and having one end of the first source/drain diffused layer coupled to one end of the resistance memory element; a second transistor including a second gate electrode and a second source/drain diffused layer, and having one end of the second source/drain diffused layer coupled to said one end of the resistance memory element and the other end of the second source/drain diffused layer coupled to the other end of the resistance memory element;
a plurality of bit lines each commonly connecting said other ends of a plurality of the resistance memory elements present in the same column;
a plurality of word lines each commonly connecting the first gate electrodes of a plurality of the first transistors present in the same row;
a plurality of reset lines formed in parallel with the word lines and commonly connecting the second gate electrodes of a plurality of the second transistors;
a column selector coupled to said a plurality of bit lines, for controlling a potential of said a plurality of bit lines;
a first row selector coupled to said a plurality of word lines, for controlling a potential of said a plurality of word lines; and
a second row selector coupled to said a plurality of reset lines, for controlling a potential of said a plurality of reset lines,
the other ends of the first source/drain diffused layers of said a plurality of first transistors being grounded,
information written in a selected one of the memory cells is read based on a current flowing in said one bit line by applying a voltage selectively to one of the word lines by the first row selector, and applying a voltage selectively to one of the bit lines by the column selector.

13. The reading method of the nonvolatile semiconductor device according to claim 12, wherein
a voltage is further applied to the reset line coupled to the selected memory cell by the second row selector.

14. An erasing method of a nonvolatile semiconductor memory device comprising:
a plurality of memory cells each including a resistance memory element which changes from a low resistance state into a high resistance state by application of a voltage which is higher than a reset voltage and lower than a set voltage and changes from the high resistance state into the low resistance state by application of a voltage higher than the set voltage; a first transistor including a first gate electrode and a first source/drain diffused layer, and having one end of the first source/drain diffused layer coupled to one end of the resistance memory element; a second transistor including a second gate electrode and a second source/drain diffused layer, and having one end of the second source/drain diffused layer coupled to said one end of the resistance memory element and the other end of the second source/drain diffused layer coupled to the other end of the resistance memory element;
a plurality of bit lines each commonly connecting said other ends of a plurality of the resistance memory elements present in the same column;
a plurality of word lines each commonly connecting the first gate electrodes of a plurality of the first transistors present in the same row;
a plurality of reset lines formed in parallel with the word lines and commonly connecting the second gate electrodes of a plurality of the second transistors;
a column selector coupled to said a plurality of bit lines, for controlling a potential of said a plurality of bit lines;
a first row selector coupled to said a plurality of word lines, for controlling a potential of said a plurality of word lines; and
a second row selector coupled to said a plurality of reset lines, for controlling a potential of said a plurality of reset lines,
the other ends of the first source/drain diffused layers of said a plurality of first transistors being grounded,
said a plurality of resistance memory elements present in the selected column are set into the high resistance state by applying a voltage to all the word lines by the first row selector, applying a voltage to all the reset lines by the second row selector, and applying a voltage selectively to one of the bit lines by the column selector.

15. An erasing method of a nonvolatile semiconductor memory device comprising:
a plurality of memory cells each including a resistance memory element which changes from a low resistance state into a high resistance state by application of a voltage which is higher than a reset voltage and lower than a set voltage and changes from the high resistance state into the low resistance state by application of a voltage higher than the set voltage; a first transistor including a first gate electrode and a first source/drain diffused layer, and having one end of the first source/drain diffused layer coupled to one end of the resistance memory element; a second transistor including a second gate electrode and a second source/drain diffused layer, and having one end of the second source/drain diffused layer coupled to said one end of the resistance memory element and the other end of the second source/drain diffused layer coupled to the other end of the resistance memory element;
a plurality of bit lines each commonly connecting said other ends of a plurality of the resistance memory elements present in the same column;
a plurality of word lines each commonly connecting the first gate electrodes of a plurality of the first transistors present in the same row;
a plurality of reset lines formed in parallel with the word lines and commonly connecting the second gate electrodes of a plurality of the second transistors;
a column selector coupled to said a plurality of bit lines, for controlling a potential of said a plurality of bit lines;
a first row selector coupled to said a plurality of word lines, for controlling a potential of said a plurality of word lines; and
a second row selector coupled to said a plurality of reset lines, for controlling a potential of said a plurality of reset lines,
the other ends of the first source/drain diffused layers of said a plurality of first transistors being grounded,
all the resistance memory elements are set in the high resistance state by applying a voltage to all the word lines by the first row selector, applying a voltage to all the reset lines by the second row selector, and applying a voltage to all the bit lines by the column selector.

* * * * *